United States Patent
Lin et al.

(10) Patent No.: US 11,142,836 B2
(45) Date of Patent: Oct. 12, 2021

(54) CATALYST MATERIAL AND METHOD FOR MANUFACTURING THE SAME

(71) Applicant: INDUSTRIAL TECHNOLOGY RESEARCH INSTITUTE, Hsinchu (TW)

(72) Inventors: Kuo-Hsin Lin, Hsinchu (TW); Li-Duan Tsai, Hsinchu (TW); Wen-Hsuan Chao, Zhunan Township (TW); Yu-Ming Lin, Tainan (TW); Pin-Hsin Yang, Tainan (TW); Hsiao-Chun Huang, Taoyuan (TW); Chiu-Ping Huang, Taoyuan (TW); Jiunn-Nan Lin, Taoyuan (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 69 days.

(21) Appl. No.: 16/204,905

(22) Filed: Nov. 29, 2018

(65) Prior Publication Data

US 2020/0173042 A1 Jun. 4, 2020

(51) Int. Cl.
*C25B 11/075* (2021.01)
*C01B 21/06* (2006.01)
(Continued)

(52) U.S. Cl.
CPC ........ *C25B 11/075* (2021.01); *C01B 21/0602* (2013.01); *C01B 21/0615* (2013.01);
(Continued)

(58) Field of Classification Search
CPC ..... C25B 11/0447; C25B 1/04; C01B 32/907; C01B 21/0602; C01B 21/0615;
(Continued)

(56) References Cited

U.S. PATENT DOCUMENTS 3,416,891 A * 12/1968 Jacques ................ C01C 1/0411
502/200
3,492,100 A 1/1970 Roubin et al.
(Continued)

FOREIGN PATENT DOCUMENTS

CN 101209424 A 7/2008
CN 101909749 A 12/2010
(Continued)

OTHER PUBLICATIONS

Arockiasamy et al (Ductility behavior of cubic titanium niobium nitride ternary alloy: a first-principles study, Indian J Phys (2016) 90(2): 149-154 (Year: 2016).*
(Continued)

*Primary Examiner* — Sheng H Davis
*Assistant Examiner* — Michael Forrest
(74) *Attorney, Agent, or Firm* — Birch, Stewart, Kolasch & Birch, LLP

(57) ABSTRACT

A method for manufacturing catalyst material is provided, which includes putting an M' target and an M" target into a nitrogen-containing atmosphere, in which M' is Ni, Co, Fe, Mn, Cr, V, Ti, Cu, or Zn, and M" is Nb, Ta, or a combination thereof. Powers are provided to the M' target and the M" target, respectively. Providing ions to bombard the M' target and the M" target to sputtering deposit $M'_a M''_b N_2$ on a substrate, wherein $0.7 \le a \le 1.7$, $0.3 \le b \le 1.3$, and $a+b=2$, wherein $M'_a M''_b N_2$ is a cubic crystal system.

7 Claims, 20 Drawing Sheets

(51) Int. Cl.
| | |
|---|---|
| *C23C 14/06* | (2006.01) |
| *C25B 1/04* | (2021.01) |
| *C23C 14/34* | (2006.01) |
| *C01B 32/907* | (2017.01) |

(52) U.S. Cl.
CPC ........ *C01B 21/0622* (2013.01); *C01B 32/907* (2017.08); *C23C 14/0635* (2013.01); *C23C 14/0641* (2013.01); *C23C 14/0664* (2013.01); *C23C 14/3464* (2013.01); *C25B 1/04* (2013.01); *C01P 2002/02* (2013.01); *C01P 2002/76* (2013.01)

(58) Field of Classification Search
CPC ............ C01B 21/0622; C23C 14/0635; C23C 14/0641; C23C 14/0664; C23C 14/3464
See application file for complete search history.

(56) References Cited

U.S. PATENT DOCUMENTS

| | | |
|---|---|---|
| 7,485,600 B2 | 2/2009 | Harutyunyan et al. |
| 8,632,672 B2 | 1/2014 | Soloveichik |
| 9,287,568 B2 | 3/2016 | Wood et al. |
| 9,683,300 B2 | 6/2017 | Noaki et al. |
| 2008/0029396 A1 | 2/2008 | Shirakura et al. |
| 2009/0318723 A1 | 12/2009 | Kortz et al. |
| 2012/0103829 A1 | 5/2012 | Tampucci et al. |
| 2014/0124360 A1 | 5/2014 | Funahashi |
| 2014/0373751 A1 | 12/2014 | Schuh et al. |
| 2015/0083585 A1 | 3/2015 | Sasaki et al. |
| 2015/0180046 A1 | 6/2015 | Serov et al. |
| 2015/0252484 A1 | 9/2015 | Chen et al. |
| 2015/0292095 A1 | 10/2015 | Haber et al. |
| 2016/0009574 A1 | 1/2016 | Hoffmann et al. |
| 2016/0077035 A1 | 3/2016 | Kanemoto et al. |
| 2016/0079604 A1 | 3/2016 | Atanasoski et al. |
| 2016/0160365 A1* | 6/2016 | Cao .......................... C25B 9/00 205/638 |
| 2017/0051419 A1 | 2/2017 | Jang et al. |
| 2017/0187046 A1 | 6/2017 | Huang et al. |
| 2017/0233879 A1 | 8/2017 | Kumta et al. |
| 2017/0321331 A1 | 11/2017 | Mitsushima et al. |
| 2018/0034065 A1 | 2/2018 | Chao et al. |

FOREIGN PATENT DOCUMENTS

| | | |
|---|---|---|
| CN | 102299347 A | 12/2011 |
| CN | 103422116 A | 12/2013 |
| CN | 103952719 A | 7/2014 |
| CN | 104327971 A | 2/2015 |
| CN | 105734606 B | 6/2018 |
| CN | 108884576 A | 11/2018 |
| KR | 10-2017-0022788 A | 3/2017 |
| TW | 544968 B | 8/2003 |
| TW | 201718396 A | 6/2017 |
| TW | 201837236 A | 10/2018 |
| TW | 201840907 A | 11/2018 |
| WO | WO 2017/001843 A1 | 1/2017 |

OTHER PUBLICATIONS

Cong et al ("Tantalum Cobalt Nitride Photocatalysts for Water Oxidation under Visible Light," Chem. Mater. 2012, 24, 579-586) (Year: 2012).*
Taiwanese Office Action and Search Report, dated Apr. 18, 2019, for Taiwanese Application No. 107142987.
Taiwanese Office Action and Search Report, dated Jun. 12, 2019, for Taiwanese Application No. 107142989.
Taiwanese Office Action and Search Report, dated Jun. 12, 2019, for Taiwanese Application No. 107142990.
U.S. Office Action dated Nov. 4, 2019 for U.S. Appl. No. 16/205,349.
Taiwanese Notice of Allowance and Search Report dated Mar. 28, 2019 for Application No. 107142991.
Bouhtiyya et al., "Application of sputtered ruthenium nitride thin films as electrode material for energy-storage devices," Scripta Materialia, vol. 68, 2013 (Available online Feb. 4, 2013), pp. 659-662.
Cattaruzza et al., "On the synthesis of a compound with positive enthalpy of formation: Zinc-blende-like RuN thin films obtained by rf-magnetron sputtering," Applied Surface Science, vol. 320, 2014 (Available online Oct. 2, 2014), pp. 863-870.
Karimi et al., "Metal Carbide and Oxide Supports for Iridium-Based Oxygen Evolution Reaction Electrocatalysts for Polymer-Electrolyte-Membrane Water Electrolysis," Electrochimica Acta, vol. 246, 2017 (Available online Jun. 15, 2017), pp. 654-670.
Li et al., "Nitrogen and Phosphorus Dual-Doped Graphene/Carbon Nanosheets as Bifunctional Electrocatalysts for Oxygen Reduction and Evolution," ACS Catalysis, vol. 5, May 27, 2015, pp. 4133-4142.
Rosestolato et al., "Electrochemical properties of stoichiometric RuN film prepared by rf-magnetron sputtering: A preliminary study," Electrochemistry Communications, vol. 49, 2014 (Available online Oct. 5, 2014), pp. 9-13.
Tang et al., "A Co-doped porous niobium nitride nanogrid as an effective oxygen reduction catalyst," Journal of Materials Chemistry A, vol. 5, Jun. 12, 2017, pp. 14278-14285.
Chen et al., "Recent Developments in Transition Metal Carbides and Nitrides as Hydrogen Evolution Electrocatalysis," Chem Commun., vol. 49, 2013 (Published Jul. 29, 2013), pp. 6896 8909.
U.S. Notice of Allowance, dated Oct. 14, 2020, for U.S. Appl. No. 16/205,341.
U.S. Notice of Allowance, dated Oct. 15, 2020, for U.S. Appl. No. 16/205,903.
Zhong et al., "Transition Metal Carbides and Nitrides in Energy Storage and Conversion," Advanced Science, vol. 3, No. 5, PubMed Chental ID: 5067566, 2016 (Electronic Publication Date: Feb. 4, 2016), pp. 1-34.
Chinese Office Action and Search Report for Chinese Application No. 201910103247.9, dated Oct. 10, 2020.
Das et al., "In Situ Fabrication of a Nicket/Motybdenum Carbide-Anchored N-Doped Graphene/CNT Hybrid: An Efficient (Pre)catatyst for OER and HER," Applied Materials and Interfaces, vol. 10, No. 41, Sep. 24, 2018, pp. 35025-35038.
Chinese Office Action and Search Report for Chinese Application No. 201911198355.5, dated Apr. 12, 2021.

* cited by examiner

CATALYST MATERIAL AND METHOD FOR MANUFACTURING THE SAME

TECHNICAL FIELD

The technical field relates to catalyst material and method for manufacturing the same.

BACKGROUND

Seeking alternative energy is imperative now due to energy shortages, and hydrogen energy is the best choice. Hydrogen gas serving as fuel meets the requirements of environmental protection, and electrolysis of water is the easiest way to generate hydrogen and oxygen. Although electrolyzing water to generate hydrogen has many advantages, it still has a fatal flaw in that it consumes a lot of energy, resulting in too high a cost. The high energy consumption in the electrolysis of water is related to an overly high over potential, and the over potential is related to electrodes, electrolyte, and the product of the electrochemical reaction. The electrodes are critical to enhancing the electrolysis performance of water. Lowering the activity energy and increasing the reaction interface are critical factors of the electrolysis performance of water. The activity energy can be lowered by the catalyst influence on the electrode surface, which is determined by the inherent catalytic properties of the electrode material. Although noble metal $IrO_2$ is one of the most catalytic electrode materials, it is expensive. As such, $IrO_2$ must be replaced with other materials for lowering the cost.

Accordingly, a novel catalyst for further enhancing the activities of hydrogen evolution reaction (HER) and oxygen evolution reaction (OER) for simultaneously achieving the catalyst activity and lowering the cost is called for.

SUMMARY

One embodiment of the disclosure provides a catalyst material, having a chemical structure of $M'_aM''_bN_2$, wherein M' is Ni, Co, Fe, Mn, Cr, V, Ti, Cu, or Zn; M'' is Nb, Ta, or a combination thereof; $0.7 \le a \le 1.7$, $0.3 \le b \le 1.3$, and $a+b=2$, wherein the catalyst material is a cubic crystal system.

In some embodiments, M' is Ni, M'' is Nb, $0.7 \le a \le 1.51$, and $0.49 \le b \le 1.30$.

One embodiment of the disclosure provides a catalyst material, having a chemical structure of $M'_cM''_dC_e$, wherein M' is Ni, Co, Fe, Mn, Cr, V, Ti, Cu, or Zn; M'' is Nb, Ta, or a combination thereof; $0.24 \le c \le 1.7$, $0.3 \le d \le 1.76$, and $0.38 \le e \le 3.61$, wherein the catalyst material is a cubic crystal system or amorphous.

In some embodiments, M' is Ni, M'' is Nb, $0.53 \le d \le 1.10$, and $0.9 \le e \le 1.9$.

In some embodiments, M' is Ni, M'' is Nb, $0.37 \le d \le 1.26$, and $0.38 \le e \le 1.30$.

In some embodiments, M' is Co, M'' is Nb, $0.61 \le d \le 1.76$, and $0.63 \le e \le 3.61$.

One embodiment of the disclosure provides a method for manufacturing catalyst material, including: putting an M' target and an M'' target into a nitrogen-containing atmosphere, wherein M' is Ni, Co, Fe, Mn, Cr, V, Ti, Cu, or Zn, and M'' is Nb, Ta, or a combination thereof; providing power to the M' target and the M'' target, respectively; and providing ions to bombard the M' target and the M'' target, to sputtering deposit $M'_aM''_bN_2$ on a substrate, wherein $0.7 \le a \le 1.7$, $0.3 \le b \le 1.3$, and $a+b=2$, wherein $M'_aM''_bN_2$ is a cubic crystal system.

In some embodiments, the power provided to the M' target is 10 W to 200 W, and the power provided to the M'' target is 10 W to 200 W.

In some embodiments, the nitrogen-containing atmosphere has a pressure of 1 mTorr to 30 mTorr.

In some embodiments, the nitrogen-containing atmosphere includes carrier gas, and the nitrogen and the carrier gas have a partial pressure ratio of 0.1 to 10.

In some embodiments, the substrate includes a porous conductive layer.

One embodiment of the disclosure provides a method for manufacturing catalyst material, including: putting an M' target, an M'' target, and a carbon target into an atmosphere of carrier gas, wherein M' is Ni, Co, Fe, Mn, Cr, V, Ti, Cu, or Zn, and M'' is Nb, Ta, or a combination thereof; providing power to the M' target, the M'' target, and the carbon target, respectively; and providing ions to bombard the M' target, the M'' target, and the carbon target to sputtering deposit $M'_cM''_dC_e$ on a substrate, wherein $0.24 \le c \le 1.7$, $0.3 \le d \le 1.76$, and $0.38 \le e \le 3.61$, wherein $M'_cM''_dC_e$ is a cubic crystal system or amorphous.

In some embodiments, the power provided to the M' target is 10 W to 200 W, the power provided to the M'' target is 10 W to 200 W, and the power provided to the carbon target is 10 W to 200 W.

In some embodiments, the atmosphere of carrier gas has a pressure of 1 mTorr to 30 mTorr.

In some embodiments, the substrate includes a porous conductive layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
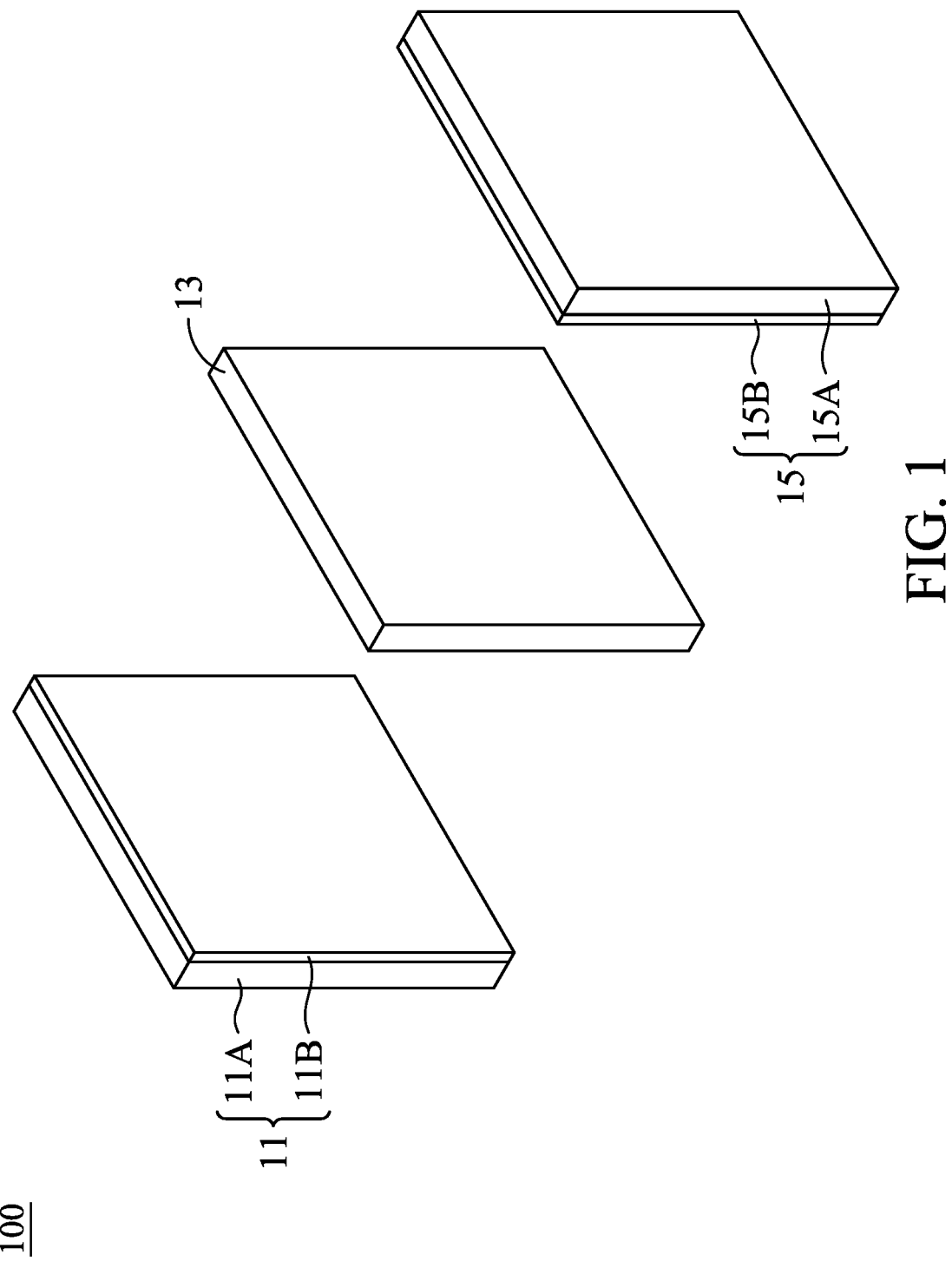
FIG. 1 shows a membrane electrode assembly in one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One embodiment of the disclosure provides a catalyst material with a chemical structure of $M'_aM''_bN_2$, wherein M' is Ni, Co, Fe, Mn, Cr, V, Ti, Cu, or Zn, M'' is Nb, Ta, or a combination thereof, $0.7 \le a \le 1.7$, $0.3 \le b \le 1.3$, and $a+b=2$, wherein the catalyst material is a cubic crystal system. In one embodiment, M' is Ni, M'' is Nb, $0.7 \le a \le 1.51$, and $0.49 \le b \le 1.30$. If a is too low (e.g. b is too high), the activity of the catalyst will be poor. If a is too high (e.g. b is too low), the activity and the stability of the catalyst will be poor.

One embodiment of the disclosure provides a catalyst material of $M'_cM''_dC_e$, wherein M' is Ni, Co, Fe, Mn, Cr, V, Ti, Cu, or Zn, M'' is Nb, Ta, or a combination thereof, $0.24 \le c \le 1.7$, $0.3 \le d \le 1.76$, and $0.38 \le e \le 3.61$, wherein $M'_cM''_dC_e$ is a cubic crystal system or amorphous. In one embodiment, M' is Ni and M'' is Nb, $0.53 \le d \le 1.10$, and $0.9 \le e \le 1.9$. In one embodiment, M' is Ni and M'' is Nb, $0.37 \le d \le 1.26$, and $0.38 \le e \le 1.30$. In one embodiment, M' is Co and M'' is Nb, $0.61 \le d \le 1.76$, and $0.63 \le e \le 3.61$. If c is too low (e.g. d is too high), the activity of the catalyst will be poor. If c is too high (e.g. d is too low), the activity and the stability of the catalyst will be poor. If e is too low, the activity of the catalyst is poor. If e is too high, the activity and the stability of the catalyst will be poor.

One embodiment of the disclosure provides a method for forming the catalyst material, including putting an M' target and an M'' target in a nitrogen-containing atmosphere, wherein M' is Ni, Co, Fe, Mn, Cr, V, Ti, Cu, or Zn, and M'' is Nb, Ta, or a combination thereof. Respectively providing power to the M' target and the M'' target, and providing ions to bombard the M' target and the M'' target for sputtering depositing $M'_aM''_bN_2$ on the substrate, wherein $0.7 \le a \le 1.7$, $0.3 \le b \le 1.3$, $a+b=2$, and $M'_aM''_bN_2$ is a cubic crystal system. In one embodiment, the nitrogen-containing atmosphere has a pressure of 1 mTorr to 30 mTorr. If the pressure of the nitrogen-containing atmosphere is too low or too high, the nitridation cannot be efficiently performed. In one embodiment, the nitrogen-containing atmosphere includes carrier gas such as helium, argon, or another suitable inert gas. The nitrogen and the carrier gas have a partial pressure ratio of 0.1 to 10. If the partial pressure ratio of the nitrogen is too low or too high, the nitridation cannot be efficiently performed. The method respectively provides power to the M' target and the M'' target. For example, the power applied to the M' target is 10 W to 200 W. If the power applied to the M' target is too low, the M' ratio in the catalyst material will be too low. If the power applied to the M' target is too high, the M' ratio in the catalyst material will be too high. On the other hand, the power applied to the M'' target is 10 W to 200 W. If the power applied to the M'' target is too low, the M'' ratio in the catalyst material will be too low. If the power applied to the M'' target is too high, the M'' ratio in the catalyst material will be too high. The power can be direct current power of RF power.

The method also provides ions to bombard the M' target and the M'' target for sputtering depositing $M'_aM''_bN_2$ on the substrate. For example, nitrogen gas and the carrier gas can be excited by plasma to form ions, and the targets are bombarded by the ions. In one embodiment, the substrate includes a porous conductive layer, such as porous metal mesh (e.g. stainless steel mesh, Ti mesh, Ni mesh, Ni alloy mesh, niobium alloy mesh, copper mesh, or aluminum mesh). The pore size of the porous conductive layer is determined by the application of $M'_aM''_bN_2$. For example, if the porous conductive layer with $M'_aM''_bN_2$ thereon serves as the anode in OER to electrolyze an alkaline aqueous solution, the porous conductive layer will have a pore size of 40 micrometers to 150 micrometers.

One embodiment of the disclosure provides a method for forming the catalyst material, including putting an M' target, an M'' target, and a carbon target in an atmosphere of carrier gas, wherein M' is Ni, Co, Fe, Mn, Cr, V, Ti, Cu, or Zn, and M'' is Nb, Ta, or a combination thereof. Respectively providing power to the M' target, the M'' target, and the carbon target, and providing ions to bombard the M' target, the M'' target, and the carbon target for sputtering depositing $M'_cM''_dC_e$ on the substrate, wherein $0.24 \le c \le 1.7$, $0.3 \le d \le 1.76$, $0.38 \le e \le 3.61$, and $M'_cM''_dC_e$ is a cubic crystal system or amorphous. In one embodiment, the atmosphere of carrier gas has a pressure of 1 mTorr to 30 mTorr. If the pressure of the atmosphere of carrier gas is too low or too high, an effective crystal cannot be formed. In one embodiment, the carrier gas can be helium, argon, another suitable inert gas, or a combination thereof. The method respectively provides power to the M' target, the M'' target, and the carbon target. For example, the power applied to the M' target is 10 W to 200 W. If the power applied to the M' target is too low, the M' ratio in the catalyst material will be too low. If the power applied to the M' target is too high, the M' ratio in the catalyst material will be too high. The power applied to the M'' target is 10 W to 200 W. If the power applied to the M'' target is too low, the M'' ratio in the catalyst material will be too low. If the power applied to the M'' target is too high, the M'' ratio in the catalyst material will be too high. On the other hand, the power applied to the carbon target is 10 W to 200 W. If the power applied to the carbon target is too low, the carbon ratio in the catalyst material will be too low. If the power applied to the carbon target is too high, the carbon ratio in the catalyst material will be too high. The power can be direct current power of RF power.

The method also provides ions to bombard the M' target, the M'' target, and the carbon target, to sputtering deposit $M'_cM''_dC_e$ on the substrate. For example, the carrier gas can be excited by plasma to form ions, and the targets are bombarded by the ions. In one embodiment, the substrate includes a porous conductive layer, such as porous metal mesh (e.g. stainless steel mesh, Ti mesh, Ni mesh, Ni alloy mesh, niobium alloy mesh, copper mesh, or aluminum mesh). The pore size of the porous conductive layer is determined by the application of $M'_cM''_dC_e$. For example, if the porous conductive layer with $M'_cM''_dC_e$ thereon serves as the anode in OER to electrolyze an alkaline aqueous solution, the porous conductive layer will have a pore size of 40 micrometers to 150 micrometers.

In one embodiment, the catalyst material can be used as a membrane electrode assembly for generating hydrogen by electrolysis. As shown in FIG. 1, the membrane electrode assembly 100 includes an anode 11, a cathode 15, and an anion exchange film 13 disposed between the anode 11 and the cathode 15. The anode 11 includes a catalyst layer 11B on the gas-liquid diffusion layer 11A, and the cathode 15 includes a catalyst layer 15B on the gas-liquid diffusion layer 15A. In addition, the anion exchange film 13 is interposed between the catalyst layer 11B of the anode 11 and catalyst layer 15B of the cathode 15. The catalyst layer 11B has a chemical structure of $M'_aM''_bN_2$ or $M'_cM''_dC_e$, and the definitions of M', M'', a, b, c, d, and e are similar to those described above and are not repeated here.

In one embodiment, the anion exchange film 13 can be a halogen ion-containing imidazole polymer or another suitable material. For example, the anion exchange film can be FAS (commercially available from Fumatech) or X37-50 (commercially available from Dioxide materials). Because the membrane electrode assembly 100 is used to generate hydrogen by electrolyzing alkaline aqueous solution, the anion exchange film 13 rather than other ionic exchange film is adopted.

In one embodiment, each of the gas-liquid diffusion layer 11A and the gas-liquid diffusion layer 15A respectively includes a porous conductive layer. For example, the gas-liquid diffusion layer 11A can be a porous metal mesh (e.g. stainless steel mesh, Ti mesh, Ni mesh, Ni alloy mesh, niobium alloy mesh, copper mesh, or aluminum mesh). On the other hand, the gas-liquid diffusion layer 15A can be a porous metal mesh (e.g. stainless steel mesh, Ti mesh, Ni mesh, Ni alloy mesh, niobium alloy mesh, copper mesh, or aluminum mesh) or a porous carbon material (e.g. carbon paper or carbon cloth). In one embodiment, the gas-liquid diffusion layer 11A has a pore size of 40 micrometers to 150 micrometers. If the pore size of the gas-liquid diffusion layer 11A is too small, the mass transfer resistance will be increased. If the pore size of the gas-liquid diffusion layer 11A is too large, the active area will be lost. In one embodiment, the gas-liquid diffusion layer 15A has a pore size of 0.5 micrometers to 5 micrometers. If the pore size of the gas-liquid diffusion layer 15A is too small, the mass transfer resistance will be increased. If the pore size of the gas-liquid diffusion layer 15A is too large, the active area will be lost.

In other embodiments, the gas-liquid diffusion layer 11A of the anode 11 and the gas-liquid diffusion layer 15A of the cathode 15 have different pore sizes and/or different compositions if necessary. On the other hand, the elements or element ratios of the catalyst layer 11B of the anode 11 and the catalyst layer 15B of the cathode 15 may be different if necessary. For example, the catalyst layer 11B may have a chemical structure of $M'_aM''_bN_2$ or $M'_cM''_dC_e$, and the catalyst layer 15B may have a chemical structure of $M_xRu_yN_2$ or $M_xRu_y$, wherein M is Ni, Co, Fe, Mn, Cr, V, Ti, Cu, or Zn, $0<x<1.3$, $0.7<y<2$, $x+y=2$, $M_xRu_yN_2$ is a cubic crystal system or amorphous, and $M_xRu_y$ is a cubic crystal system. In this embodiment, the gas-liquid diffusion layer 11A can be a porous metal mesh, and the gas-liquid diffusion layer 11B can be a porous carbon paper to further increase the durability of the membrane electrode assembly in electrolysis. Alternatively, the catalyst layer 11B has a chemical structure of $M'_aM''_bN_2$ or $M'_cM''_dC_e$, and the cathode 15 can be a commercially available electrode.

The membrane electrode assembly can be used for generating hydrogen by electrolysis. For example, the membrane electrode assembly can be dipped in alkaline aqueous solution. The alkaline aqueous solution can be an aqueous solution of NaOH, KOH, another suitable alkaline, or a combination thereof. In one embodiment, the alkaline aqueous solution has a pH value of greater than 14 and less than 15. If the pH value of the alkaline aqueous solution is too low, the conductivity of the alkaline aqueous solution will be poor. If the pH value of the alkaline aqueous solution is too high, the viscosity of the alkaline aqueous solution will be too high. The method also involves in applying a voltage to the anode and the cathode to electrolyze the alkaline aqueous solution to generate hydrogen by the cathode and generate oxygen by the anode.

Accordingly, the catalyst of the embodiments meets the requirement of electrolyzing alkaline aqueous solution to generate hydrogen. In OER aspect, the catalyst in the embodiments may overcome the poor catalytic effect, poor conductivity, low corrosion resistance, low anti-oxidation ability, and other problems of conventional catalysts. The catalyst should have a high conductivity and high electrochemical activity of OER. In view of the diffusion in the catalyst of the embodiments, the grain boundary diffusion coefficient is much larger than the body diffusion coefficient at low temperatures. Because the impurity atoms added into the catalyst may fill the grain boundaries, which may block the diffusion of atoms via the grain boundaries for improving the catalyst performance. The fast diffusion path of the catalyst (e.g. grain boundaries) can be filled by some material, thereby preventing the adjacent material atoms from diffusion via the grain boundaries or other defects. The diffusion of the atoms via grain boundaries is greatly reduced by introducing nitrogen atoms or carbon atoms into the seams of grain boundaries. Accordingly, the nitrogen atom and carbon atom can increase the anti-oxidation ability and stability of the catalyst material. Because the nitride and the carbide has excellent conductivity and simultaneously meet the requirements of activity and cost, the nitride or carbide of M'' (has an activity similar to Pt) can be combined with M' to obtain the catalyst with high conductivity and electrochemical activity.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Preparation Example 1

Pt catalyst was deposited on a glass carbon electrode (5 mm OD×4 mm H) by a reactive magnetron sputter. A Pt target was put into the sputter to be applied a power. Nitrogen with a flow rate of 20 sccm was introduced into the sputter, and the pressure in the sputter was 30 mTorr. The Pt target was bombarded by argon ions to perform the sputtering at room temperature for 5 minutes to 6 minutes, thereby forming the Pt catalyst with a thickness of about 100 nm on the glass carbon electrode. The loading amount of the catalyst was 0.042 mg.

Preparation Example 2

$Ni_xRu_y$ catalysts of different element ratios were respectively deposited on glass carbon electrodes (5 mm OD×4 mm H) by the reactive magnetron sputter. A Ni target and a Ru target were put into the sputter, and powers applied to the Ni target (10 W to 200 W) and the Ru target (10 W to 200

W) were adjusted. Nitrogen with a flow rate of 20 sccm was introduced into the sputter, and the pressure in the sputter was 20 mTorr. The Ni target and the Ru target were bombarded by argon ions to perform the reactive sputtering at room temperature for 5 minutes to 6 minutes, thereby respectively forming the $Ni_xRu_y$ catalysts with a thickness of about 100 nm on the glass carbon electrodes. The loading amount of the catalyst was 0.024 mg. The $Ni_xRu_y$ catalysts had x of about 0.065 to 0.85 and y of about 1.935 to 1.15, which were determined by EDS. The $Ni_xRu_y$ catalysts had surface morphology of granular, which were determined by SEM. The $Ni_xRu_y$ catalysts were cubic crystal system, which were determined by X-ray diffraction. In addition, only the Ru target was put into the sputter to form a Ru catalyst film with a thickness of 100 nm on the glass carbon electrode by the similar conditions, and the catalyst loading amount was 0.024 mg.

Preparation Example 3

$Ni_xRu_yN_2$ catalysts of different element ratios were respectively deposited on glass carbon electrodes (5 mm OD×4 mm H) by the reactive magnetron sputter. A Ni target and a Ru target were put into the sputter, and powers applied to the Ni target (10 W to 200 W) and the Ru target (10 W to 200 W) were adjusted. Nitrogen and argon with a total flow rate of 20 sccm (e.g. nitrogen:(nitrogen+argon)=50:100) were introduced into the sputter, and the pressure in the sputter was 20 mTorr. The Ni target and the Ru target were bombarded by argon ions to perform the reactive sputtering at room temperature for 5 minutes to 6 minutes, thereby respectively forming the $Ni_xRu_yN_2$ catalysts with a thickness of about 100 nm on the glass carbon electrodes. The loading amount of the catalyst was 0.024 mg. The $Ni_xRu_yN_2$ catalysts had x of about 0.069 to 1.086 and y of about 1.931 to 0.914, which were determined by EDS. The $Ni_xRu_yN_2$ catalysts had surface morphology of tetrahedron or pyramidal, which were determined by SEM. The $Ni_xRu_yN_2$ catalysts were cubic crystal system, which were determined by X-ray diffraction. In addition, only the Ru target was put into the sputter to form a $Ru_2N_2$ catalyst film with a thickness of 100 nm on the glass carbon electrode by the similar conditions, and the catalyst loading amount was 0.024 mg.

Example 1

Figure 2:
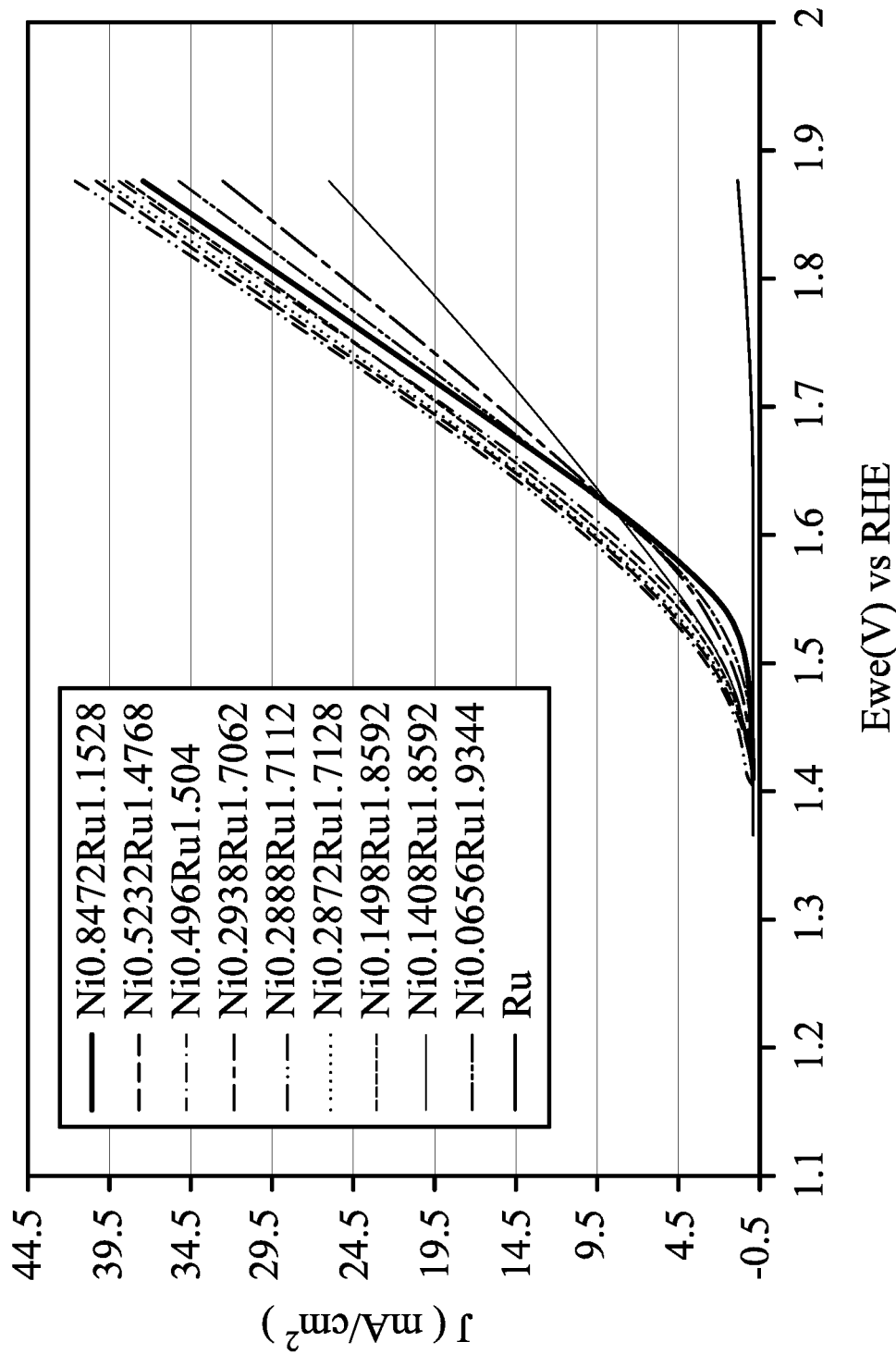
FIG. 2 shows OER curves of Ru catalyst and $Ni_xRu_y$ catalysts in one embodiment.
Figure 3:
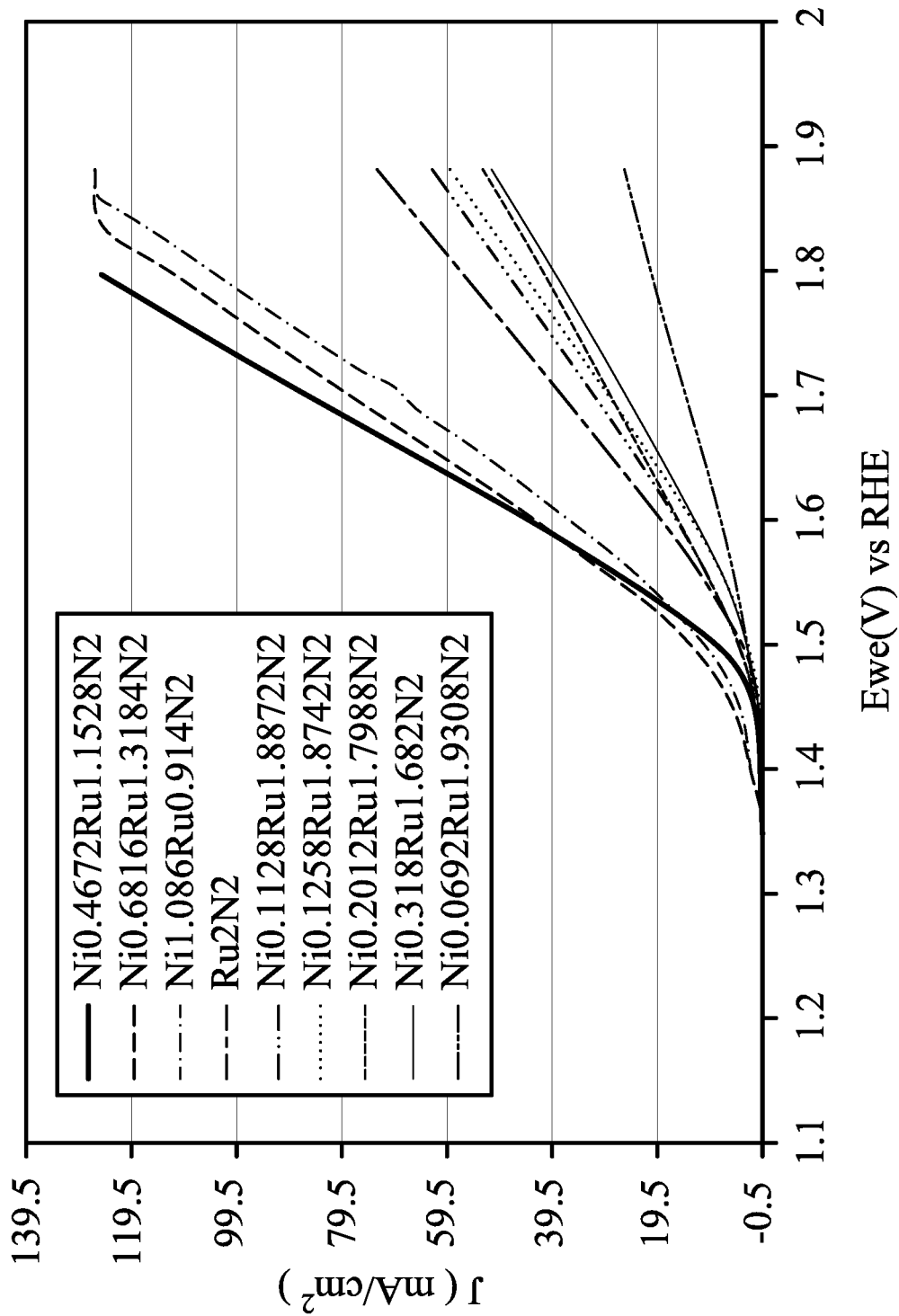
FIG. 3 shows OER curves of $Ru_2N_2$ catalyst and $Ni_xRu_yN_2$ catalysts in one embodiment.

The OER electrochemical activities of the Pt, Ru, $Ru_2N_2$, $Ni_xRu_y$, and $Ni_xRu_yN_2$ catalysts were tested as below. In 0.1M KOH solution, the glass carbon electrode with the Pt, Ru, $Ru_2N_2$, $Ni_xRu_y$, or $Ni_xRu_yN_2$ catalyst formed thereon served as a working electrode. Hg/HgO served as a reference electrode, and platinum served as an auxiliary electrode. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIG. 2 (e.g. Ru and $Ni_xRu_y$) and FIG. 3 ($Ru_2N_2$ and $Ni_xRu_yN_2$). The horizontal axis in FIGS. 2 and 3 is potential (V) of reversible hydrogen electrode (RHE), and the vertical axis in FIGS. 2 and 3 is current density (J, mA/cm$^2$). As shown in FIG. 2, the pure Ru catalyst was free of the OER activity, and the activities of the Ru catalysts doped with appropriate amounts of Ni were obviously enhanced. As shown in FIG. 3, the activity of the $Ru_2N_2$ catalyst was greatly higher than the activity of the Ru catalyst, and the activities of the $Ru_2N_2$ catalysts doped with appropriate amounts of Ni (e.g. $Ni_xRu_yN_2$ catalysts) were greatly enhanced. For example, the $Ni_xRu_yN_2$ with x of 0.4 to 1.1 could have a better performance. A comparison of some catalysts is shown in Table 1:

TABLE 1

| OER comparison | Best current density (mA/cm$^2$) at the RHE potential of 1.65 V | Initial potential (V) for electrolysis of water (current density was set to 0.5 mA/cm$^2$) |
| --- | --- | --- |
| Pt film | ~10 | 1.48-1.5 |
| $Ni_{0.29}Ru_{1.71}$ | ~15 | 1.4-1.55 |
| $Ni_{0.46}Ru_{1.53}N_2$ | ~65 | 1.4-1.5 |

As shown in Table 1, the current densities of the $Ni_{0.29}Ru_{1.71}$ and $Ni_{0.46}Ru_{1.53}N_2$ catalysts were higher than the current density of the Pt film catalyst in OER. However, the $Ni_xRu_y$ was free of the anti-oxidation ability, it should be improper to be applied in OER. In other words, the $Ni_{0.46}Ru_{1.53}N_2$ catalyst was more suitable than the Pt film catalyst in the application of OER.

Example 2

Figure 4:
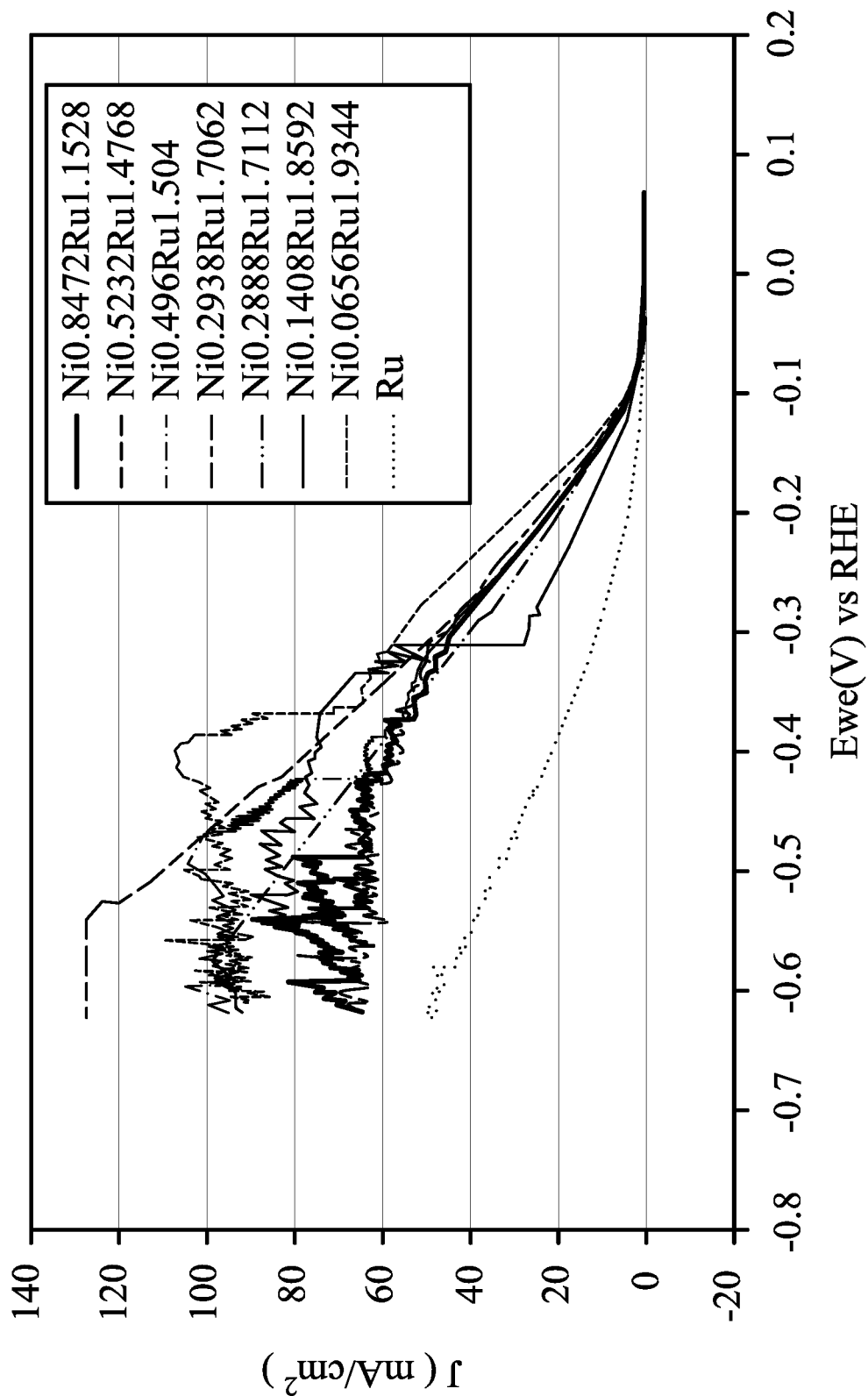
FIG. 4 shows HER curves of Ru catalyst and $Ni_xRu_y$ catalysts in one embodiment.
Figure 5:
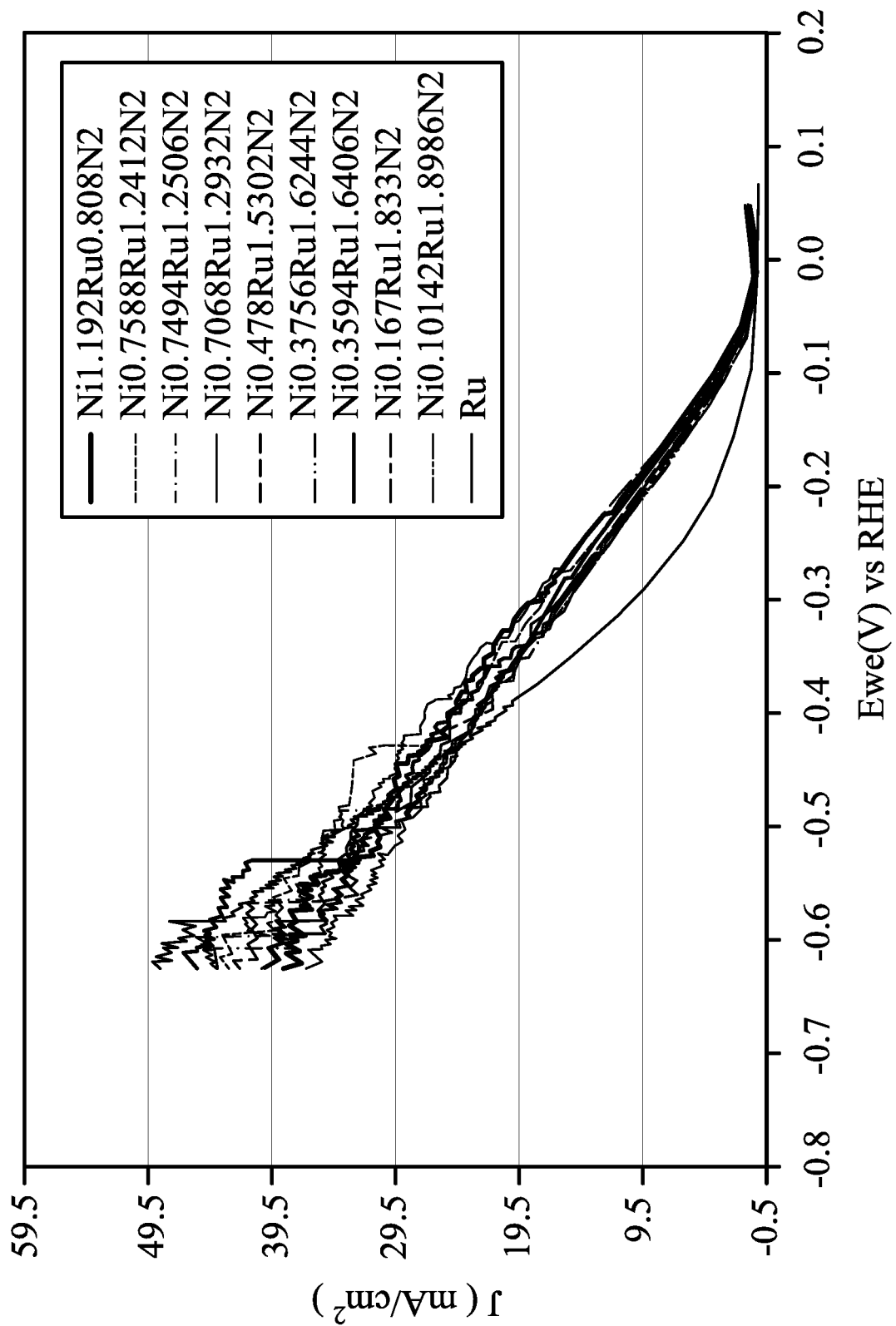
FIG. 5 shows HER curves of Ru catalysts and $Ni_xRu_yN_2$ catalysts in one embodiment.

The HER electrochemical activities of the Pt, Ru, $Ni_xRu_y$, and $Ni_xRu_yN_2$ catalysts were tested as below. In 0.1M KOH solution, the glass carbon electrode with the Pt, Ru, $Ru_2N_2$, $Ni_xRu_y$, or $Ni_xRu_yN_2$ catalyst formed thereon served as a working electrode. Hg/HgO served as a reference electrode, and platinum served as an auxiliary electrode. In measurements of the HER, the working electrode was rotated at 1600 rpm, the scan voltage ranged from 0 to 1V, the scan rate was 10 mV/s, and the number of scans was 3. The HER results are shown in FIG. 4 (e.g. Ru and $Ni_xRu_y$) and FIG. 5 (Ru and $Ni_xRu_yN_2$). The horizontal axis in FIGS. 2 and 3 is potential (V) of reversible hydrogen electrode (RHE), and the vertical axis in FIGS. 2 and 3 is current density (J, mA/cm$^2$). As shown in FIG. 4, the activities of the Ru catalysts doped with Ni (e.g. $Ni_xRu_y$) were obviously higher than the activity of the Ru catalyst. A comparison of some catalysts is shown in Table 2:

TABLE 2

| HER comparison | Best current density (mA/cm$^2$) at the RHE potential of 0.3 V |
| --- | --- |
| Pt film | 14 |
| Ru film | ~10 |
| $Ni_{0.06}Ru_{1.93}$ | 55 |
| $Ni_{1.2}Ru_{0.8}N_2$ | 19.5 |

As shown above, the current densities of the $Ni_{0.06}Ru_{1.93}$ and $Ni_{1.2}Ru_{0.8}N_2$ catalysts were higher than the current density of the Pt film catalyst in HER. In other words, the $Ni_{0.06}Ru_{1.93}$ and $Ni_{1.2}Ru_{0.8}N_2$ catalyst was more suitable than the Pt film catalyst in the application of HER.

Preparation Example 4

$Mn_xRu_yN_2$ catalysts of different element ratios were respectively deposited on glass carbon electrodes (5 mm OD×4 mm H) by the reactive magnetron sputter. An Mn target and a Ru target were put into the sputter, and powers applied to the Mn target (10 W to 200 W) and the Ru target (10 W to 200 W) were adjusted. Nitrogen and argon with a total flow rate of 20 sccm (e.g. nitrogen:(nitrogen+argon)=50:100) were introduced into the sputter, and the pressure in the sputter was 20 mTorr. The Mn target and the Ru target were bombarded by argon ions to perform the reactive sputtering at room temperature for 5 minutes to 6 minutes, thereby respectively forming the $Mn_xRu_yN_2$ catalysts with a thickness of about 100 nm on the glass carbon electrodes. The loading amount of the catalyst was 0.024 mg. The $Mn_xRu_yN_2$ catalysts had x of about 0.01 to 0.8 and y of about 1.2 to 1.99, which were determined by EDS.

Example 3

Figure 6:
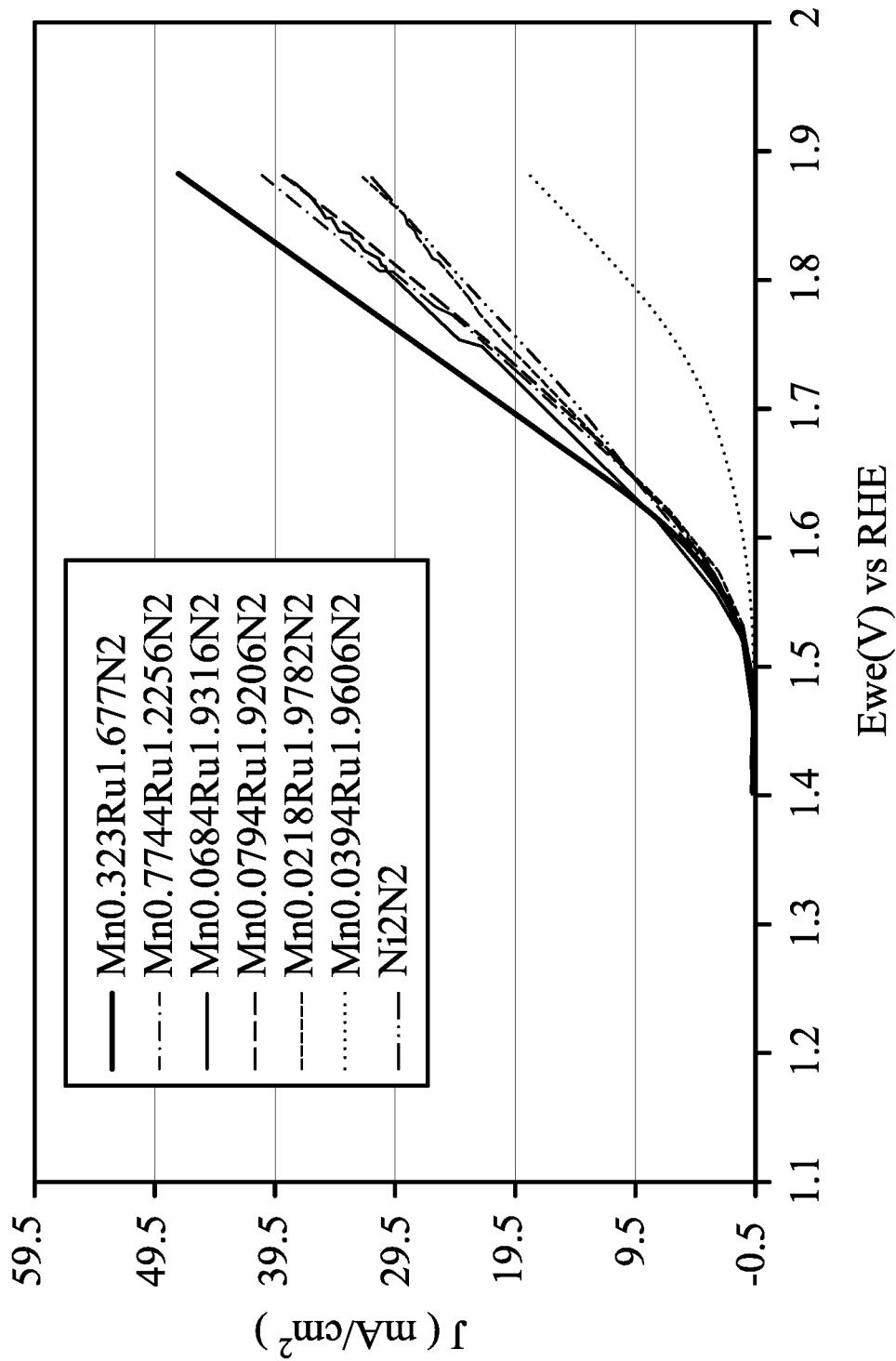
FIG. 6 shows OER curves of $Ni_2N_2$ catalyst and $Mn_xRu_yN_2$ catalysts in one embodiment.

The OER electrochemical activities of the $Mn_xRu_yN_2$ catalysts were tested as below. In 0.1M KOH solution, the glass carbon electrode with the $Mn_xRu_yN_2$ catalyst formed thereon served as a working electrode. Hg/HgO served as a reference electrode, and platinum served as an auxiliary electrode. The working electrode was rotated at 1600 rpm. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIG. 6 ($Ni_2N_2$ and $Mn_xRu_yN_2$). The horizontal axis in FIG. 6 is potential (V) of reversible hydrogen electrode (RHE), and the vertical axis in FIG. 6 is current density (J, mA/cm$^2$). As shown in FIG. 6, the activities of the $Ru_2N_2$ catalysts doped with appropriate amounts of Mn (e.g. $Mn_xRu_yN_2$ catalysts) were greatly enhanced. For example, the $Mn_xRu_yN_2$ with x of 0.3 to 0.7 could have a better performance. A comparison of some catalysts is shown in Table 3:

TABLE 3

| OER comparison | Best current density (mA/cm$^2$) at the RHE potential of 1.65 V | Initial potential (V) for electrolysis of water (current density was set to 0.5 mA/cm$^2$) |
| --- | --- | --- |
| Pt film | ~10 | 1.48-1.5 |
| $Mn_{0.323}RU_{1.677}N_2$ | 13 | 1.5-1.55 |

As shown in Table 3, the current density of the $Mn_{0.323}Ru_{1.677}N_2$ catalyst was higher than the current density of the Pt film catalyst in OER. In other words, the $Mn_{0.323}Ru_{1.677}N_2$ catalyst was more suitable than the Pt film catalyst in the application of OER.

Example 4

Figure 7:
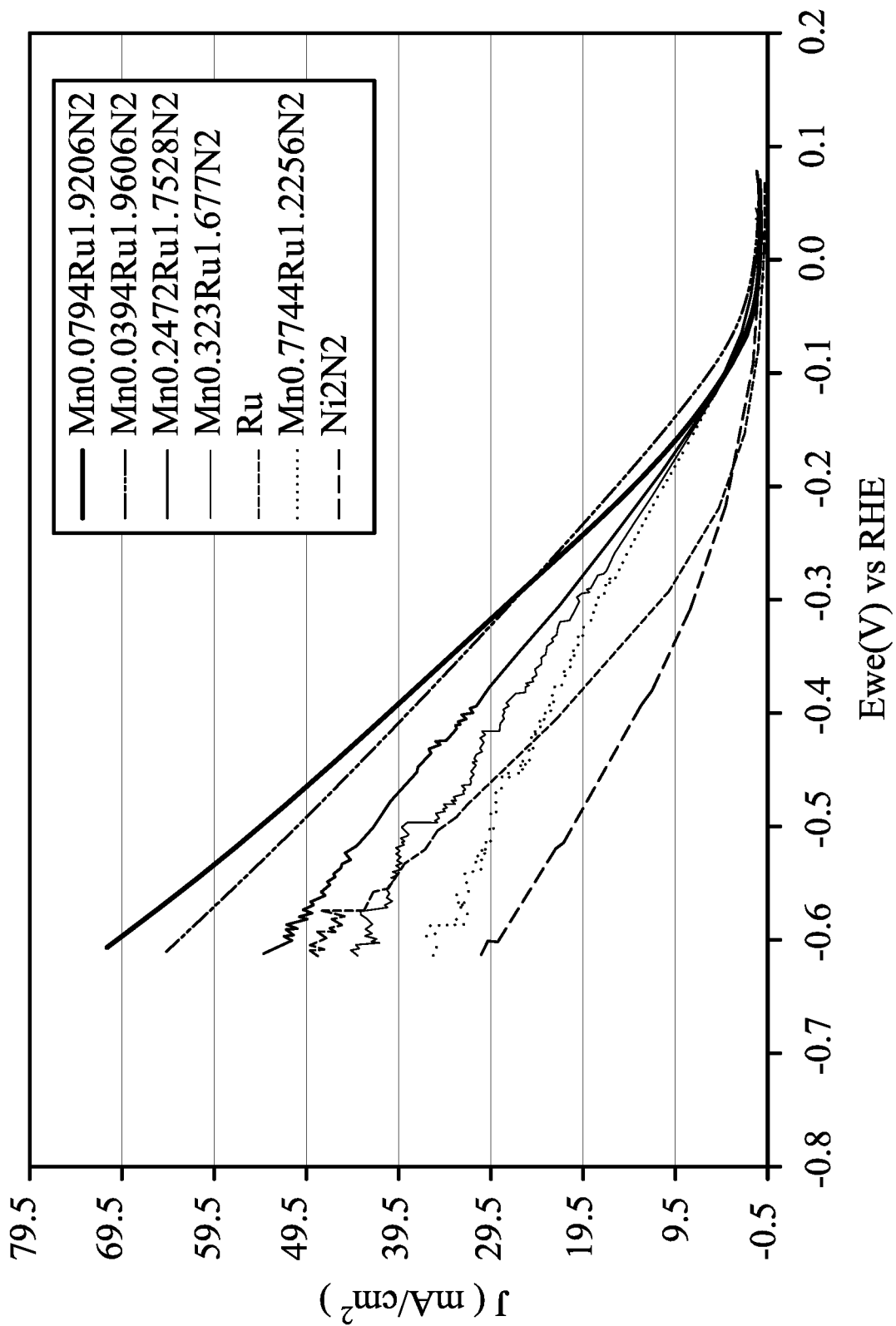
FIG. 7 shows HER curves of $Ni_2N_2$ catalyst and $Mn_xRu_yN_2$ catalysts in one embodiment.

The HER electrochemical activities of the $Mn_xRu_yN_2$ catalysts were tested as below. In 0.1M KOH solution, the glass carbon electrode with the $Mn_xRu_yN_2$ catalyst formed thereon served as a working electrode. Hg/HgO served as a reference electrode, and platinum served as an auxiliary electrode. In measurements of the HER, the working electrode was rotated at 1600 rpm, the scan voltage ranged from 0 to 1V, the scan rate was 10 mV/s, and the number of scans was 3. The HER results are shown in FIG. 7. The horizontal axis in FIG. 7 is potential (V) of reversible hydrogen electrode (RHE), and the vertical axis in FIG. 7 is current density (J, mA/cm$^2$). A comparison of some catalysts is shown in Table 4:

TABLE 4

| HER comparison | Best current density (mA/cm$^2$) at the RHE potential of 0.3 V |
| --- | --- |
| Pt film | 14 |
| Ru film | ~10 |
| $Mn_{0.079}Ru_{1.92}N_2$ | 28 |

As shown above, the current density of the $Mn_{0.079}Ru_{1.92}N_2$ catalyst was higher than the current density of the Pt film catalyst in HER. In other words, the $Mn_{0.079}Ru_{1.92}N_2$ catalyst was more suitable than the Pt film catalyst in the application of HER.

Preparation Example 5

$Ni_aNb_bN_2$ catalysts of different element ratios were respectively deposited on glass carbon electrodes (5 mm OD×4 mm H) by the reactive magnetron sputter. A Ni target and a Nb target were put into the sputter, and powers applied to the Ni target (10 W to 200 W) and the Nb target (10 W to 200 W) were adjusted. Nitrogen and argon with a total flow rate of 10 sccm (e.g. nitrogen:(nitrogen+argon)=50:100) were introduced into the sputter, and the pressure in the sputter was 5 mTorr. The Ni target and the Nb target were bombarded by argon ions to perform the reactive sputtering at room temperature for 5 minutes to 6 minutes, thereby respectively forming the $Ni_aNb_bN_2$ catalysts with a thickness of about 100 nm on the glass carbon electrodes. The loading amount of the catalyst was 0.017 mg. The $Ni_aNb_bN_2$ catalysts had a of about 0.3128 to 1.5082 and y of about 0.5095 to 1.6872, which were determined by EDS. The $Ni_aNb_bN_2$ catalysts were cubic crystal system, which were determined by XRD.

Preparation Example 6

$Ni_cNb_dC_e$ catalysts of different element ratios were respectively deposited on glass carbon electrodes (5 mm OD×4 mm H) by the reactive magnetron sputter. A Ni target, a Nb target, and a carbon target were put into the sputter, and powers applied to the Ni target (10 W to 200 W), the Nb target (10 W to 200 W), and the carbon target (10 W to 200 W) were adjusted. Argon with a flow rate of 10 sccm was introduced into the sputter, and the pressure in the sputter was 5 mTorr. The Ni target, the Nb target, and the carbon target were bombarded by argon ions to perform the reactive sputtering at room temperature for 5 minutes to 6 minutes, thereby respectively forming the $Ni_cNb_dC_e$ catalysts with a thickness of about 100 nm on the glass carbon electrodes. The loading amount of the catalyst was 0.017 mg. The $Ni_cNb_dC_e$ catalysts had c of about 0.58 to 1.47, d of about 0.53 to 1.42, and e of about 0.92 to 2.47, which were determined by EDS. The $Ni_cNb_dC_e$ catalysts were cubic crystal system or amorphous, which were determined by XRD. In addition, only the Nb target and the carbon target were put into the sputter to form $Nb_{0.6556}C_{1.3444}$ catalyst film with a thickness of 100 nm on the glass carbon electrode by the similar conditions, and the catalyst loading amount was 0.017 mg.

Preparation Example 7

$Ni_cNb_dC_e$ catalysts of different element ratios were respectively deposited on glass carbon electrodes (5 mm OD×4 mm H) by the reactive magnetron sputter. A Ni target, a Nb target, and a carbon target were put into the sputter, and powers applied to the Ni target (10 W to 200 W), the Nb target (10 W to 200 W), and the carbon target (10 W to 200 W) were adjusted. Argon with a flow rate of 10 sccm was introduced into the sputter, and the pressure in the sputter was 5 mTorr. The Ni target, the Nb target, and the carbon target were bombarded by argon ions to perform the reactive sputtering at room temperature for 5 minutes to 6 minutes, thereby respectively forming the $Ni_cNb_dC_e$ catalysts with a thickness of about 100 nm on the glass carbon electrodes. The loading amount of the catalyst was 0.017 mg. The $Ni_cNb_dC_e$ catalysts had c of about 0.74 to 1.63, d of about 0.37 to 1.26, and e of about 0.38 to 1.30, which were determined by EDS. The $Ni_cNb_dC_e$ catalysts were cubic crystal system or amorphous, which were determined by XRD.

Example 5

Figure 8:
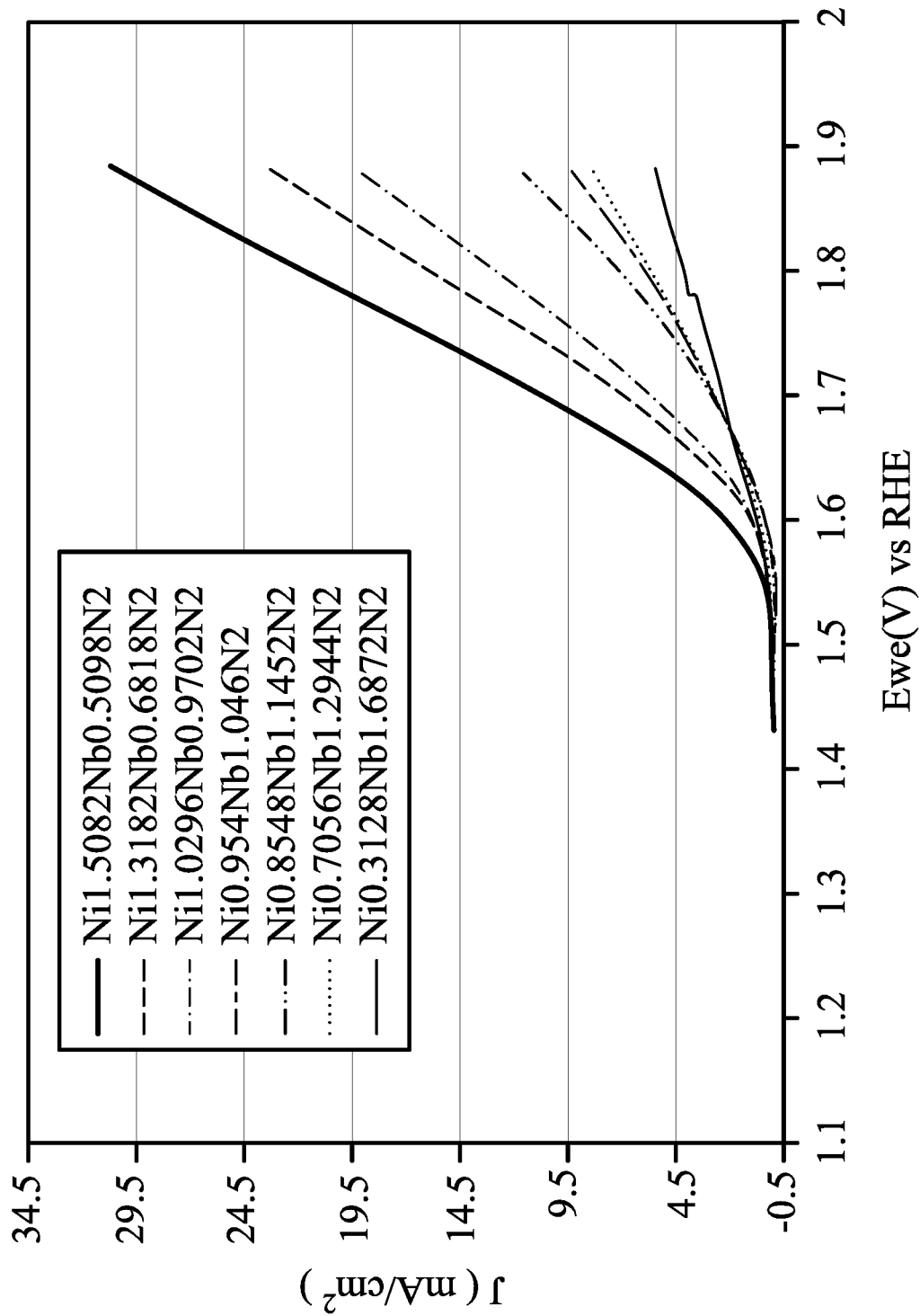
FIG. 8 shows OER curves of $Ni_aNb_bN_2$ catalysts in one embodiment.
Figure 9:
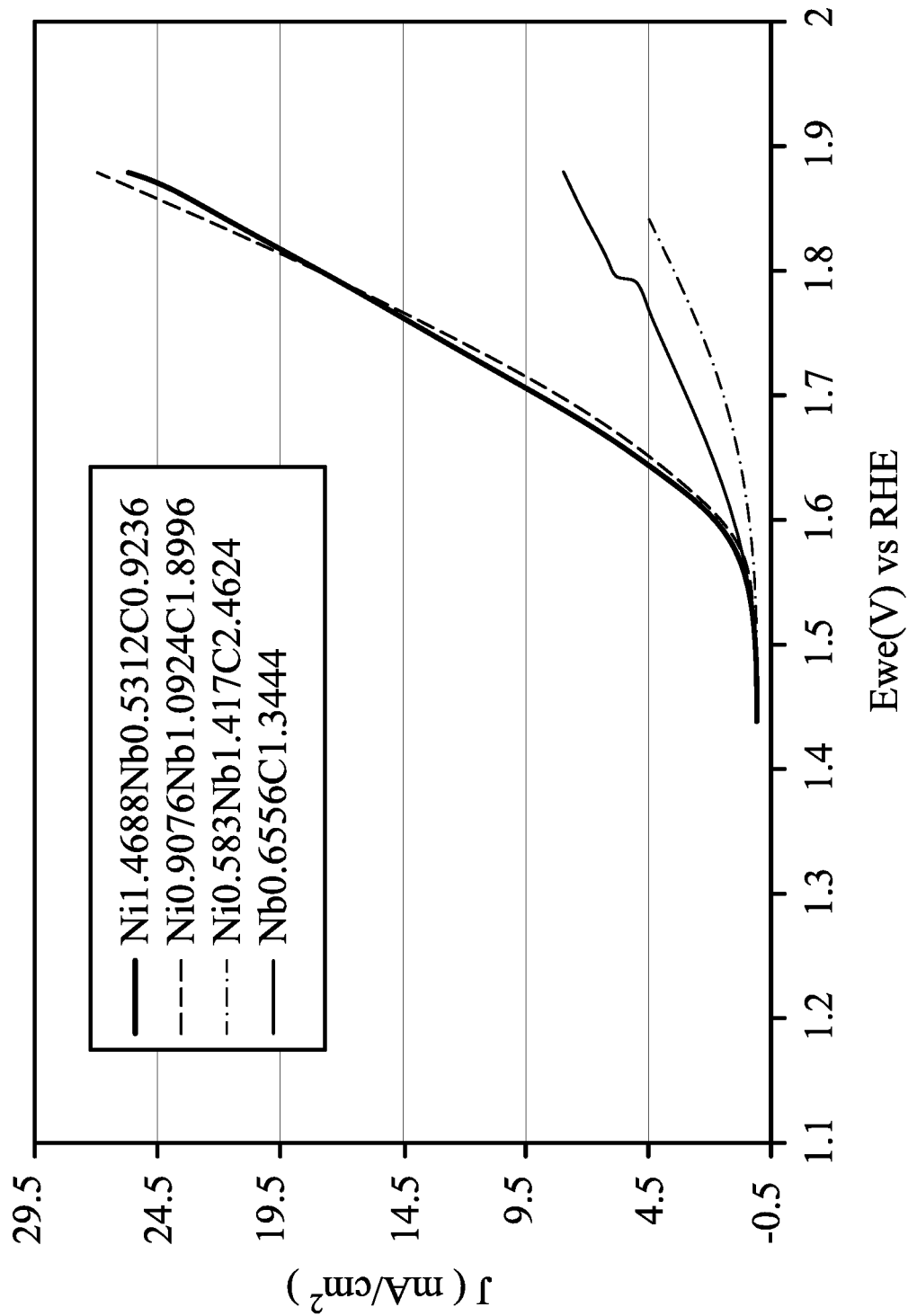
FIG. 9 shows OER curves of $Ni_cNb_dC_e$ and $Nb_{0.6556}C_{1.3444}$ catalysts in one embodiment.
Figure 10:
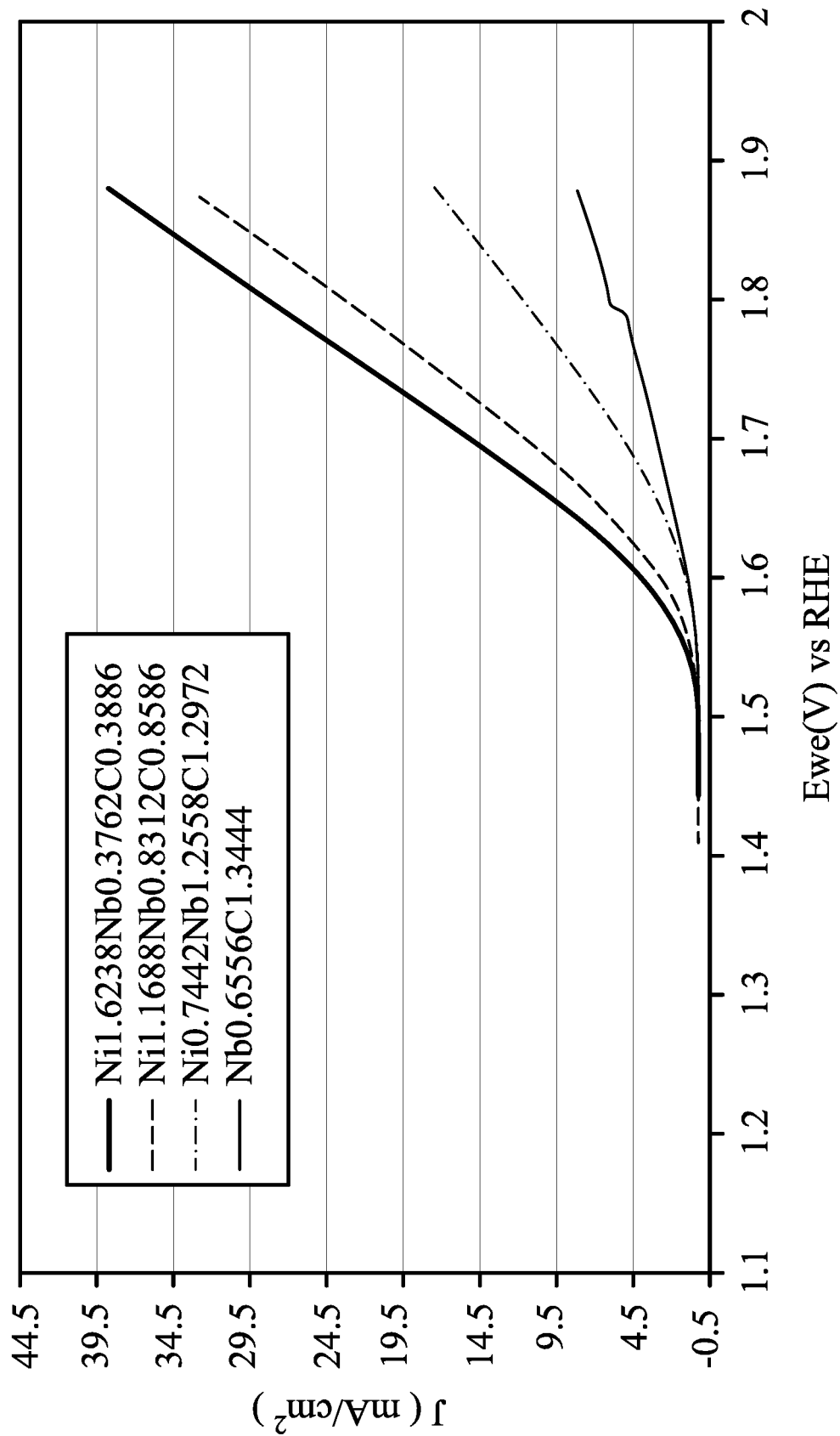
FIG. 10 shows OER curves of $Ni_cNb_dC_e$ and $Nb_{0.6556}C_{1.3444}$ catalysts in one embodiment.
Figure 11:
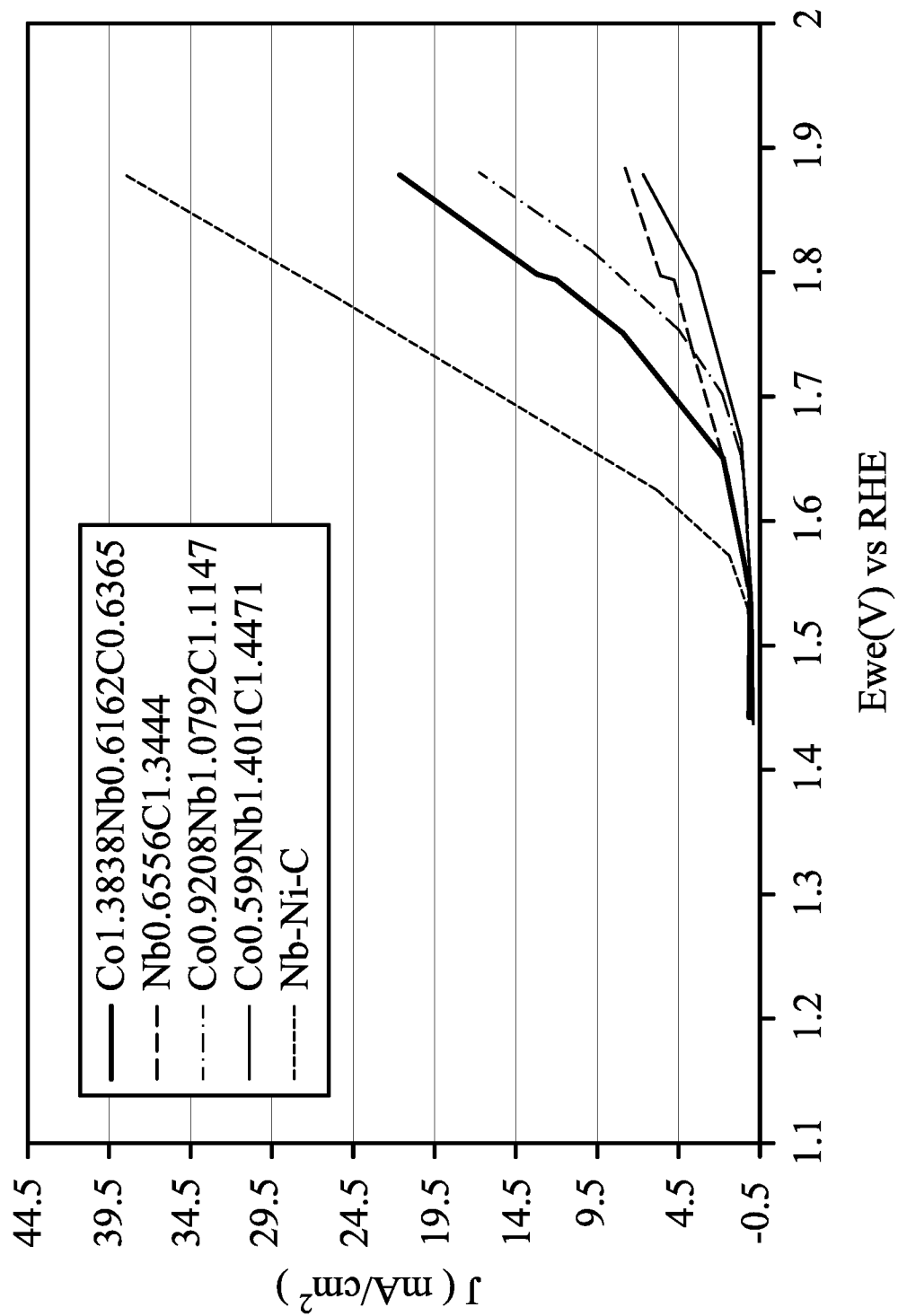
FIG. 11 shows OER curves of $Co_cNb_dC_e$ and $Nb_{0.6556}C_{1.3444}$ catalysts in one embodiment.
Figure 12:
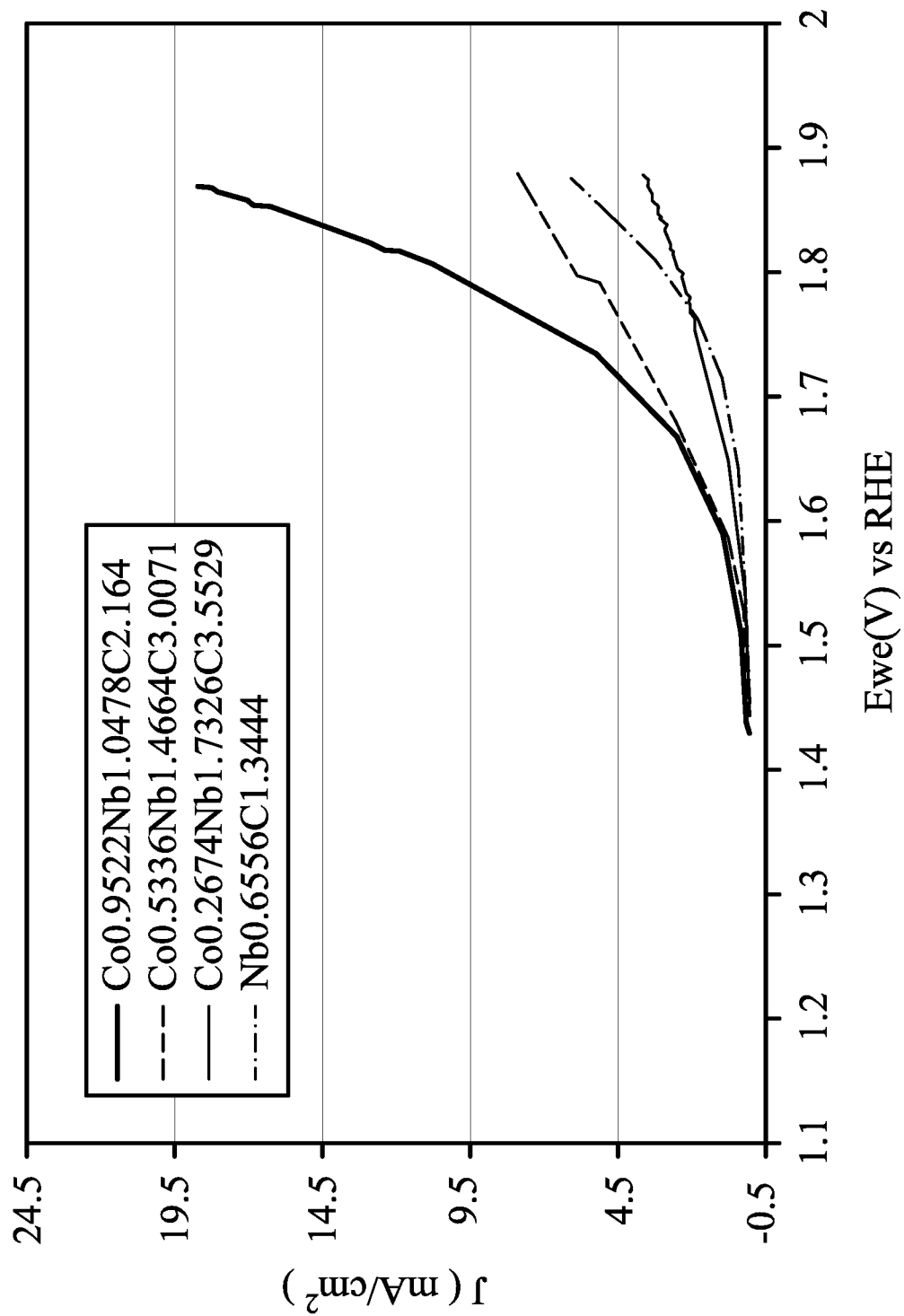
FIG. 12 shows OER curves of $Co_cNb_dC_e$ and $Nb_{0.6556}C_{1.3444}$ catalysts in one embodiment.
Figure 13:
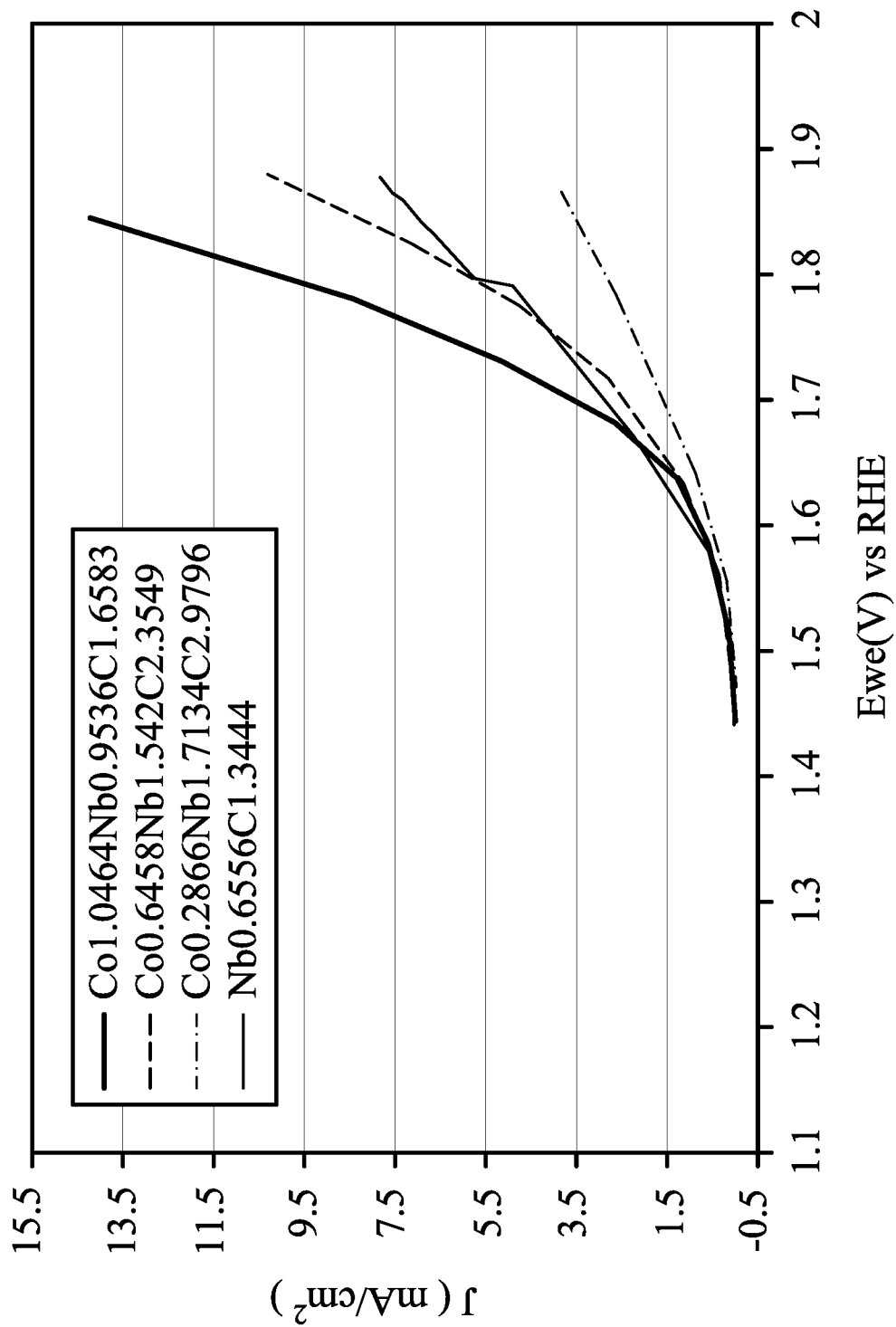
FIG. 13 shows OER curves of $Co_cNb_dC_e$ and $Nb_{0.6556}C_{1.3444}$ catalysts in one embodiment.
Figure 14:
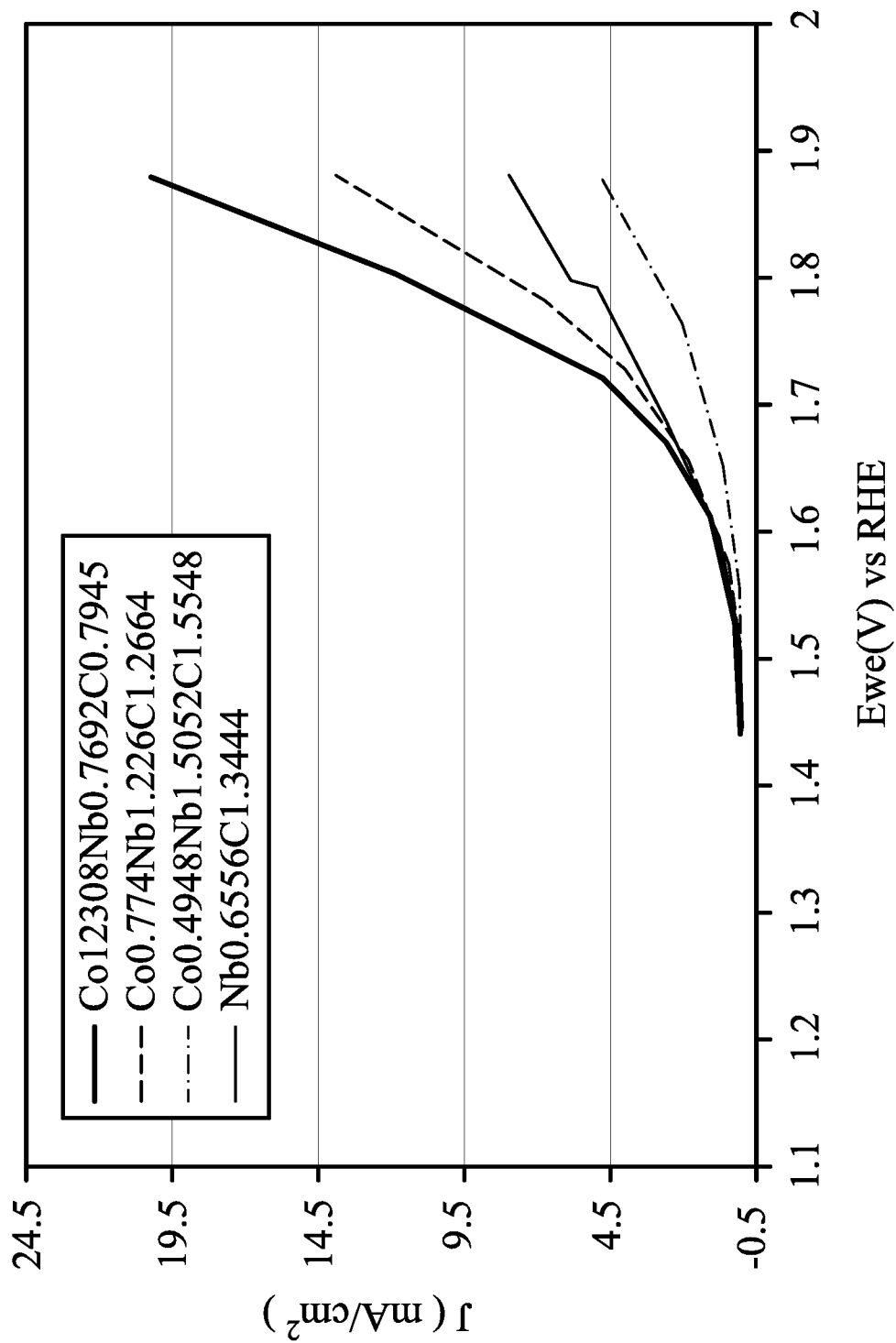
FIG. 14 shows OER curves of $Co_cNb_dC_e$ and $Nb_{0.6556}C_{1.3444}$ catalysts in one embodiment.
Figure 15:
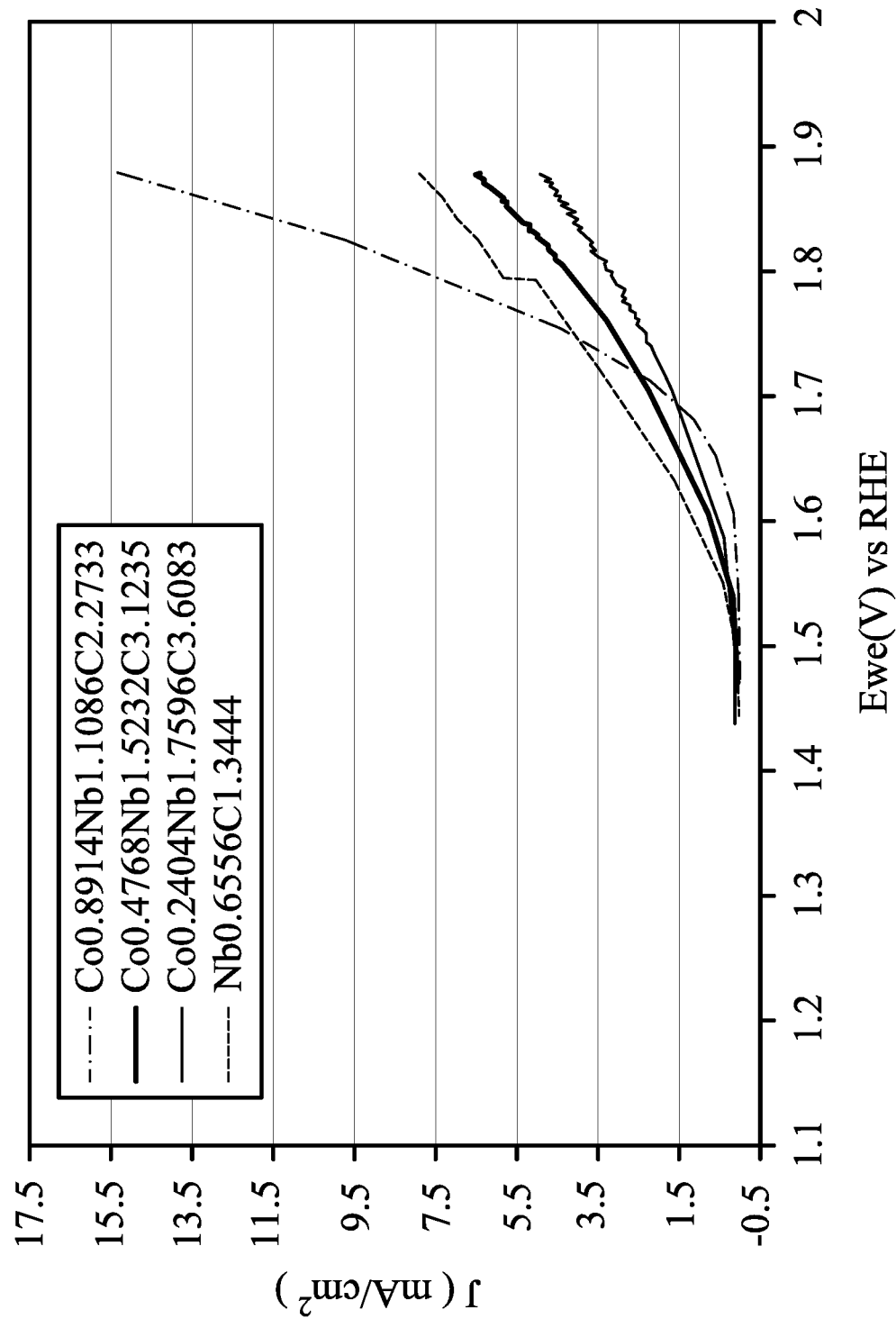
FIG. 15 shows OER curves of $Co_cNb_dC_e$ and $Nb_{0.6556}C_{1.3444}$ catalysts in one embodiment.

The OER electrochemical activities of the Pt, $Ni_aNb_bN_2$, $Ni_cNb_dC_e$, and $Nb_{0.6556}C_{1.3444}$ catalysts were tested as below. In 0.1M KOH solution, the glass carbon electrode with the Pt, $Ni_aNb_bN_2$, $Ni_cNb_dC_e$, or $Nb_{0.6556}C_{1.3444}$ catalyst formed thereon served as a working electrode. Hg/HgO served as a reference electrode, and platinum served as an auxiliary electrode. The working electrode was rotated at 1600 rpm. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIG. 8 (e.g. $Ni_aNb_bN_2$), FIG. 9 ($Ni_cNb_dC_e$ and $Nb_{0.6556}C_{1.3444}$), and FIG. 10 ($Ni_cNb_dC_e$ and $Nb_{0.6556}C_{1.3444}$). The horizontal axis in FIGS. 8 to 10 is potential (V) of reversible hydrogen electrode (RHE), and the vertical axis in FIGS. 8 to 10 is current density (J, mA/cm$^2$). As shown in FIG. 8, the activities of the $Nb_2N_2$ catalysts doped with appropriate amounts of Ni (e.g. $Ni_aNb_bN_2$ catalysts) were greatly enhanced. As shown in FIGS. 9 and 10, the activities of the NbC catalysts doped with appropriate amounts of Ni (e.g. $Ni_cNb_dC_e$ catalysts) were greatly enhanced. A comparison of some catalysts is shown in Table 5:

TABLE 5

| OER comparison | Best current density (mA/cm$^2$) at the RHE potential of 1.8 V | Initial potential (V) for electrolysis of water (current density was set to 0.5 mA/cm$^2$) |
|---|---|---|
| Pt | ~18 | 1.48-1.5 |
| $Ni_{1.5}Nb_{0.5}N_2$ | ~22 | 1.5-1.55 |
| $Ni_{1.62}Nb_{0.37}C_{0.39}$ | ~28 | 1.5-1.55 |

As shown in Table 5, the current densities of the $Ni_{1.5}Nb_{0.5}N_2$ and $Ni_{1.62}Nb_{0.37}C_{0.39}$ catalysts were higher than the current density of the Pt film catalyst in OER. In other words, the $Ni_{1.5}Nb_{0.5}N_2$ and $Ni_{1.62}Nb_{0.37}C_{0.39}$ catalysts were more suitable than the Pt film catalyst in the application of OER.

Preparation Example 8

$Co_cNb_dC_e$ catalysts of different element ratios were respectively deposited on glass carbon electrodes (5 mm OD×4 mm H) by the reactive magnetron sputter. A Co target, a Nb target, and a carbon target were put into the sputter, and powers applied to the Co target (30 W to 100 W), the Nb target (35 W), and the carbon target (100 W) were adjusted. Argon with a flow rate of 10 sccm was introduced into the sputter, and the pressure in the sputter was 5 mTorr. The Co target, the Nb target, and the carbon target were bombarded by argon ions to perform the reactive sputtering at room temperature for 10 minutes to 15 minutes, thereby respectively forming the $Co_cNb_dC_e$ catalysts with a thickness of about 100 nm on the glass carbon electrodes. The loading amount of the catalyst was 0.017 mg. The $Co_cNb_dC_e$ catalysts had c of about 0.24 to 1.39, d of about 0.61 to 1.76, and e of about 0.63 to 3.61, which were determined by EDS. The $Co_cNb_dC_e$ catalysts were cubic crystal system or amorphous, which were determined by XRD.

Example 6

The OER electrochemical activities of the $Co_cNb_dC_e$ and $Nb_{0.6556}C_{1.3444}$ catalysts were tested as below. In 0.1M KOH solution, the glass carbon electrode with the $Co_cNb_dC_e$ or $Nb_{0.6556}C_{1.3444}$ catalyst formed thereon served as a working electrode. Hg/HgO served as a reference electrode, and platinum served as an auxiliary electrode. The working electrode was rotated at 1600 rpm. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIGS. 11 to 15 ($Co_cNb_dC_e$ and $Nb_{0.6556}C_{1.3444}$). The horizontal axis in FIGS. 11 to 15 is potential (V) of reversible hydrogen electrode (RHE), and the vertical axis in FIGS. 11 to 15 is current density (J, mA/cm$^2$). As shown in FIGS. 11 to 15, the activities of the $Nb_dC_e$ catalysts doped with appropriate amounts of Co (e.g. $Co_cNb_dC_e$ catalysts) were greatly enhanced.

Preparation Example 9

$Ni_{1.5}Nb_{0.5}N_2$ catalyst was deposited on stainless steel mesh (316 stainless steel, 200 mesh, 50 mm×50 mm) by the reactive magnetron sputter. A Ni target and a Nb target were put into the sputter, and powers applied to the Ni target (10 W to 200 W) and the Nb target (10 W to 200 W) were adjusted. Nitrogen and argon with a total flow rate of 10 sccm (e.g. nitrogen:(nitrogen+argon)=50:100) were introduced into the sputter, and the pressure in the sputter was 5 mTorr. The Ni target and the Nb target were bombarded by argon ions to perform the reactive sputtering at room temperature for 8 minutes, thereby forming the $Ni_{1.5}Nb_{0.5}N_2$ catalysts (determined by EDS) with a thickness of about 300 nm on the stainless steel mesh. The loading amount of the catalyst per area was 0.17 mg/cm$^2$. The $Ni_{1.5}Nb_{0.5}N_2$ catalyst was cubic crystal systems, which was determined by XRD.

Example 7

Figure 16:
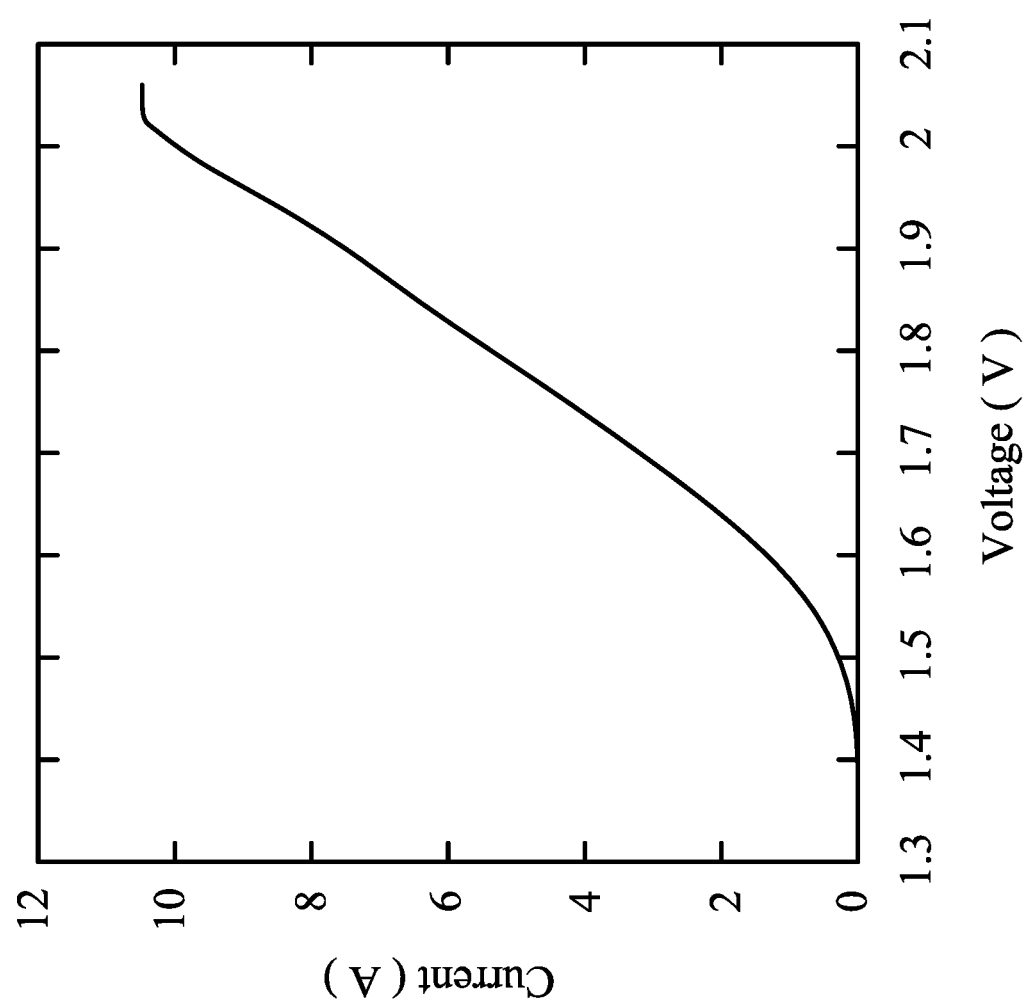
FIGS. 16 to 19 show curves of current versus voltage of membrane electrode assemblies in the embodiments.

Commercially available PtC (HISPEC 13100, Johnson Matthey) was coated on a carbon paper H23C8 (Freudenberg) to serve as a cathode of HER, and the loading amount of the cathode catalyst per area was controlled to 1.8 mg/cm$^2$. The $Ni_{1.5}Nb_{0.5}N_2$-stainless steel mesh in Preparation Example 9 served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 16. The membrane electrode assembly could generate a current of 10.2 A, and the impedance of the entire test system was 27 mΩ. The decay rate per minute of the membrane electrode assembly was 0.001%.

Preparation Example 10

$Ni_{1.62}Nb_{0.37}C_{0.39}$ catalyst was deposited on stainless steel mesh (316 stainless steel, 200 mesh, 50 mm×50 mm) by the reactive magnetron sputter. A Ni target, a Nb target, and a carbon target were put into the sputter, and powers applied to the Ni target (10 W to 200 W), the Nb target (10 W to 200 W), and the carbon target (10 W to 200 W) were adjusted. Argon with a flow rate of 10 sccm was introduced into the sputter, and the pressure in the sputter was 5 mTorr. The Ni target, the Nb target, and the carbon target were bombarded by argon ions to perform the reactive sputtering at room temperature for 8 minutes, thereby forming the $Ni_{1.62}Nb_{0.37}C_{0.39}$ catalysts (determined by EDS) with a thickness of about 300 nm on the stainless steel mesh. The loading amount of the catalyst per area was 0.17 mg/cm². The $Ni_{1.62}Nb_{0.37}C_{0.39}$ catalyst was cubic crystal systems or amorphous, which was determined by XRD.

Example 8

Figure 17:
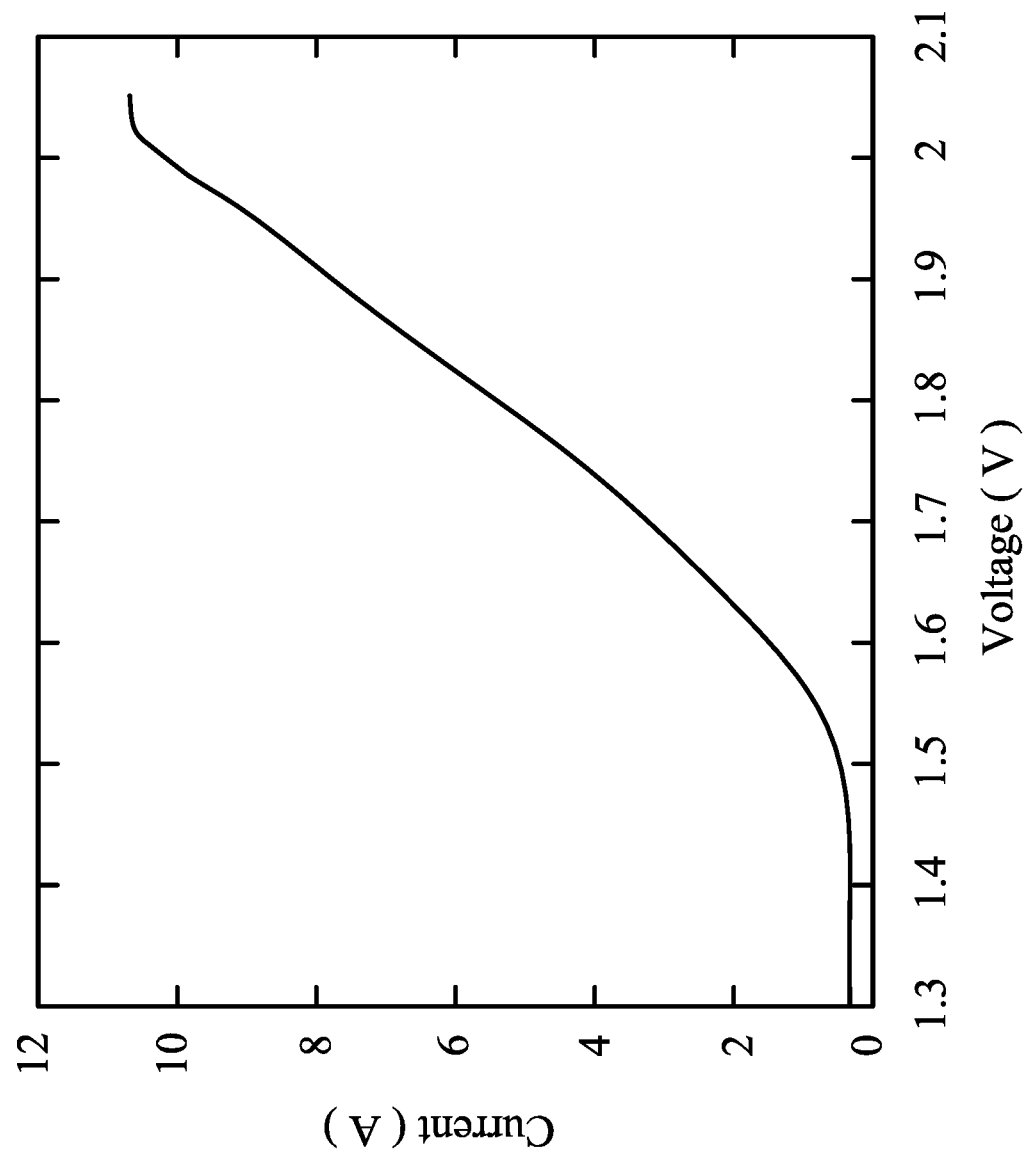

Commercially available PtC (HISPEC 13100, Johnson Matthey) was coated on a carbon paper H23C8 (Freudenberg) to serve as a cathode of HER, and the loading amount of the cathode catalyst per area was controlled to 1.8 mg/cm². The $Ni_{1.62}Nb_{0.37}C_{0.39}$-stainless steel mesh in Preparation Example 10 served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 17. The membrane electrode assembly could generate a current of 10.2 A, and the impedance of the entire test system was 33 mΩ. The decay rate per minute of the membrane electrode assembly was 0.02%.

Comparative Example 1

Figure 18:
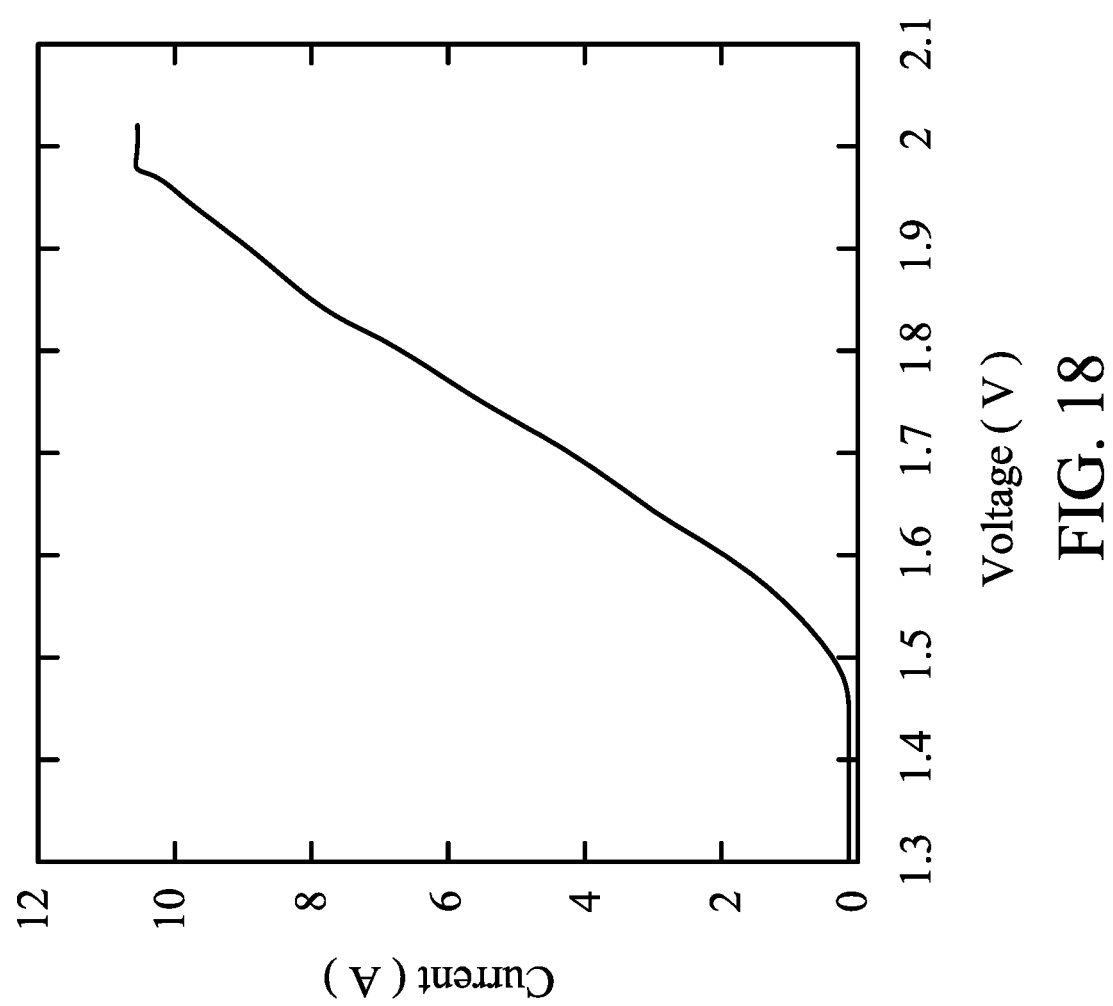

Commercially available PtC (HISPEC 13100, Johnson Matthey) was coated on a carbon paper H23C8 (Freudenberg) to serve as a cathode of HER, and the loading amount of the cathode catalyst per area was controlled to 1.8 mg/cm². Commercially available insoluble anode ($IrO_2$/$RuO_2$—Ti mesh, Ultrapack Energy Co., Ltd) served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 18. The membrane electrode assembly could generate a current of 10.6 A, and the impedance of the entire test system was 40 mΩ. The decay rate per minute of the membrane electrode assembly was 0.0087%.

Comparison of the membrane electrode assemblies in Example 7, Example 8, and Comparative Example 1 are shown in Table 6:

TABLE 6

| | Cathode | Loading amount of the catalyst per area (mg/cm²) | Anode | Loading amount of the catalyst per area (mg/cm²) | OER catalyst activity (A/mg) at 2 V | Decay rate per minute (%) | Initial potential (V) for electrolysis of water (current density was set to 0.5 mA/cm²) |
|---|---|---|---|---|---|---|---|
| Example 7 | PtC/H23C8 | 1.8 | $Ni_{1.5}Nb_{0.5}N_2$-stainless steel mesh | 0.17 | 2.37 | 0.001 | 1.52 |
| Example 8 | PtC/H23C8 | 1.8 | $Ni_{1.62}Nb_{0.37}C_{0.39}$-stainless steel mesh | 0.17 | 2.41 | 0.02 | 1.51 |
| Comparative Example 1 | PtC/H23C8 | 1.8 | $IrO_2$/$RuO_2$-Ti mesh | 2 | 0.23 | 0.0087 | 1.52 |

As shown in Table 6, the activities of the $Ni_{1.5}Nb_{0.5}N_2$ catalyst and the $Ni_{1.62}Nb_{0.37}C_{0.39}$ catalyst were greatly higher than the activity of the commercially available anode catalyst.

Preparation Example 11

$Ni_{0.75}Ru_{1.25}N_2$ catalyst was deposited on stainless steel mesh (316 stainless steel, 200 mesh, 50 mm×50 mm) by the reactive magnetron sputter. A Ni target and a Ru target were put into the sputter, and powers were applied to the Ni target (150 W) and the Ru target (100 W). Nitrogen and argon (e.g. nitrogen:(nitrogen+argon)=50:100) were introduced into the sputter, and the pressure in the sputter was 5 mTorr. The Ni target and the Ru target were bombarded by argon ions to perform the reactive sputtering at room temperature for 8 minutes, thereby forming the $Ni_{0.75}Ru_{1.25}N_2$ catalysts (determined by EDS) with a thickness of about 300 nm on the stainless steel mesh. The loading amount of the catalyst per area was 0.17 mg/cm². The $Ni_{0.75}Ru_{1.25}N_2$ catalyst had surface morphology of tetrahedron or pyramidal, which were determined by SEM. The $Ni_{0.75}Ru_{1.25}N_2$ catalyst was cubic crystal systems or amorphous, which was determined by XRD.

Example 9

Figure 19:
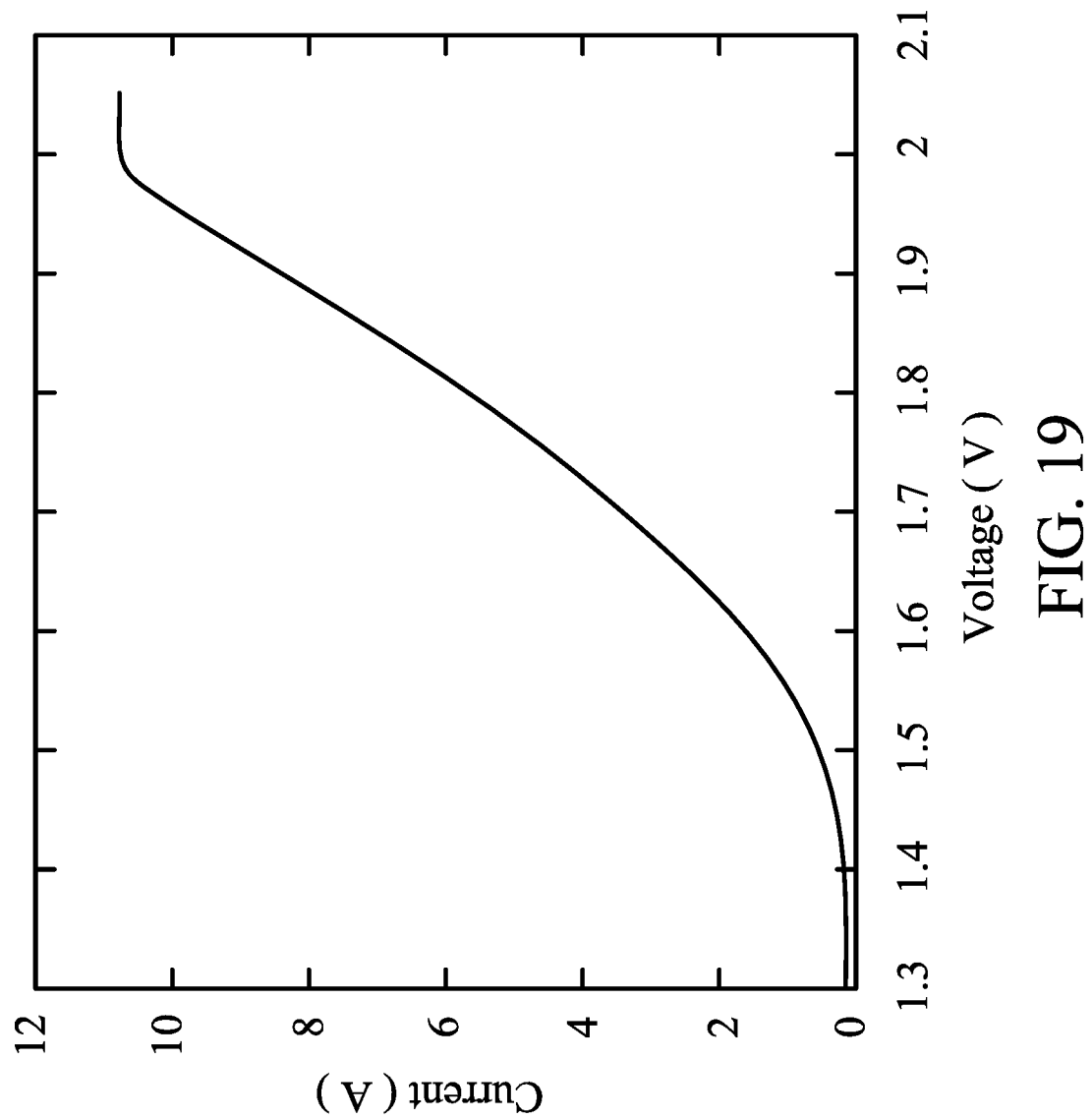
Figure 20:
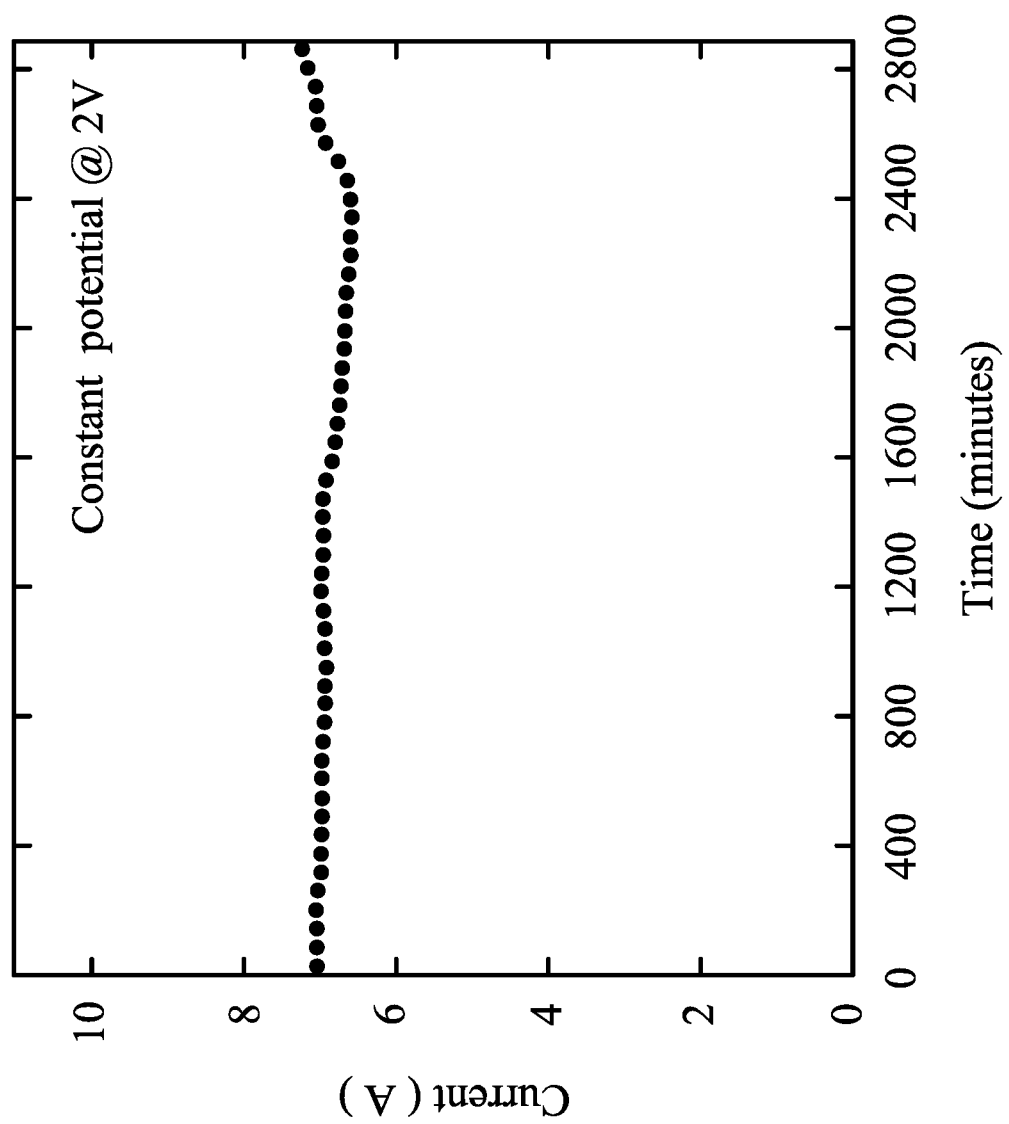
FIG. 20 shows the current diagram of a membrane electrode assembly after long-term use in one embodiment.

The $Ni_{0.75}Ru_{1.25}N_2$-stainless steel mesh in Preparation Example 11 served as the cathode of HER, the $Ni_{1.5}Nb_{0.5}N_2$-stainless steel mesh in Preparation Example 9 served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The membrane electrode assembly could generate a current of 10.5 A at 1.87V, and the impedance of the entire test system was 12 mΩ. The decay rate per minute of the membrane electrode assembly was 0.0057%.

to 2.2V and the scan rate was 50 mV/s. The curve of current versus voltage of the membrane electrode assembly is shown in FIG. 19. The membrane electrode assembly could generate a current of 10.5 A at 1.96V, and the impedance of the entire test system was 17 mΩ. The decay rate per minute of the membrane electrode assembly was 0.000035%. The potential of the membrane electrode assembly was controlled at 2V to continuously operate 48 hours, and its current was stable as shown in FIG. 20. In other words, the $Ni_{0.75}Ru_{1.25}N_2$-carbon paper could withstand the chemically reduction, the $Ni_{1.5}Nb_{0.5}N_2$-stainless steel mesh could withstand the oxidation, and the $Ni_{0.75}Ru_{1.25}N_2$-carbon paper and the $Ni_{1.5}Nb_{0.5}N_2$-stainless steel mesh could resist the alkaline corrosion.

Comparison of the membrane electrode assemblies in Example 7, Example 9, and Example 10 are shown in Table 7:

TABLE 7

| | Cathode | Loading amount of the catalyst per area (mg/cm$^2$) | Anode | Loading amount of the catalyst per area (mg/cm$^2$) | OER catalyst activity (A/mg) at 2 V | Decay rate per minute (%) | Initial potential (V) for electrolysis of water (current density was set to 0.5 mA/cm$^2$) |
|---|---|---|---|---|---|---|---|
| Example 9 | $Ni_{0.75}Ru_{1.25}N_2$-staineless steel mesh | 0.17 | $Ni_{1.5}Nb_{0.5}N_2$-stainless steel mesh | 0.17 | 2.47 | 0.0057 | 1.53 |
| Example 10 | $Ni_{0.75}Ru_{1.25}N_2$-H23C8 | 0.17 | $Ni_{1.5}Nb_{0.5}N_2$-stainless steel mesh | 0.17 | 2.47 | 0.000035 | 1.50 |
| Example 7 | PtC/H23C8 | 1.8 | $Ni_{1.5}Nb_{0.5}N_2$-stainless steel mesh | 0.17 | 0.23 | 0.07 | 1.50 |

Preparation Example 12

$Ni_{0.75}Ru_{1.25}N_2$ catalyst was deposited on carbon paper (H23C8, Freudenberg, 50 mm×50 mm) by the reactive magnetron sputter. A Ni target and a Ru target were put into the sputter, and powers were applied to the Ni target (150 W) and the Ru target (100 W). Nitrogen and argon (e.g. nitrogen:(nitrogen+argon)=50:100) were introduced into the sputter, and the pressure in the sputter was 5 mTorr. The Ni target and the Ru target were bombarded by argon ions to perform the reactive sputtering at room temperature for 8 minutes, thereby forming the $Ni_{0.75}Ru_{1.25}N_2$ catalysts (determined by EDS) with a thickness of about 300 nm on the carbon paper H23C8. The loading amount of the catalyst per area was 0.17 mg/cm$^2$. The $Ni_{0.75}Ru_{1.25}N_2$ catalyst had surface morphology of tetrahedron or pyramidal, which were determined by SEM. The $Ni_{0.75}Ru_{1.25}N_2$ catalyst was cubic crystal systems or amorphous, which was determined by XRD.

Example 10

The $Ni_{0.75}Ru_{1.25}N_2$-carbon paper in Preparation Example 12 served as the cathode of HER, the $Ni_{1.5}Nb_{0.5}N_2$-stainless steel mesh in Preparation Example 9 served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V As shown in Table 7, the $Ni_{0.75}Ru_{1.25}N_2$ catalyst serving as the catalyst layer of the cathode could greatly enhance the catalyst activity. In addition, the $Ni_{0.75}Ru_{1.25}N_2$ catalyst formed on the carbon paper could further improve the durability of the membrane electrode assembly.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A catalyst material, having a chemical structure of:
$M'_aM''_bN_2$,
wherein M' is Ni, Co, Fe, Mn, Cu, or Zn;
M" is Nb, Ta, or a combination thereof;
$0.7 \leq a \leq 1.7$, $0.3 \leq b \leq 1.3$, and $a+b=2$,
wherein the catalyst material is a cubic crystal system.

2. The catalyst material as claimed in claim 1, wherein M' is Ni, M" is Nb, $0.7 \leq a \leq 1.51$, and $0.49 \leq b \leq 1.30$.

3. A method for manufacturing the catalyst material as claimed in claim 1, comprising:
putting an M' target and an M" target into a nitrogen-containing atmosphere, wherein M' is Ni, Co, Fe, Mn, Cu, or Zn, and M" is Nb, Ta, or a combination thereof;
providing power to the M' target and the M" target, respectively; and
providing ions to bombard the M' target and the M" target, to sputtering deposition of $M'_aM''_bN_2$ on a substrate, wherein $0.7 \leq a \leq 1.7$, $0.3 \leq b \leq 1.3$, and $a+b=2$,
wherein $M'_aM''_bN_2$ is a cubic crystal system.

4. The method as claimed in claim 3, wherein the power provided to the M' target is 10 W to 200 W, and the power provided to the M" target is 10 W to 200 W.

5. The method as claimed in claim 3, wherein the nitrogen-containing atmosphere has a pressure of 1 mTorr to 30 mTorr.

6. The method as claimed in claim 3, wherein the nitrogen-containing atmosphere comprises carrier gas, and the nitrogen and the carrier gas have a partial pressure ratio of 0.1 to 10.

7. The method as claimed in claim 3, wherein the substrate comprises a porous conductive layer.

\* \* \* \* \*